United States Patent
Chen et al.

(10) Patent No.: US 9,146,378 B2
(45) Date of Patent: Sep. 29, 2015

(54) IMAGE CAPTURING LENS ASSEMBLY, IMAGE CAPTURING DEVICE AND MOBILE TERMINAL

(71) Applicant: LARGAN Precision Co., Ltd., Taichung (TW)

(72) Inventors: Kuan-Ming Chen, Taichung (TW); Hsin-Hsuan Huang, Taichung (TW)

(73) Assignee: LARGAN PRECISION CO., LTD., Taichung (TW)

( * ) Notice: Subject to any disclaimer, the term of this patent is extended or adjusted under 35 U.S.C. 154(b) by 1 day.

(21) Appl. No.: 14/094,478

(22) Filed: Dec. 2, 2013

(65) Prior Publication Data

US 2015/0108597 A1 Apr. 23, 2015

(30) Foreign Application Priority Data

Oct. 18, 2013 (TW) .............................. 102137700 A

(51) Int. Cl.
*G02B 9/12* (2006.01)
*G02B 13/00* (2006.01)
*H01L 27/146* (2006.01)

(52) U.S. Cl.
CPC .............. *G02B 13/0035* (2013.01); *G02B 9/12* (2013.01); *H01L 27/14625* (2013.01)

(58) Field of Classification Search
CPC .............................. G02B 9/12; G02B 13/0035
USPC .................................................. 359/784, 791
See application file for complete search history.

(56) References Cited

U.S. PATENT DOCUMENTS

| 8,094,231 B2 | 1/2012 | Tsai |
|---|---|---|
| 2004/0021957 A1* | 2/2004 | Isono ............................ 359/791 |
| 2005/0041306 A1* | 2/2005 | Matsuo ......................... 359/689 |
| 2006/0092529 A1* | 5/2006 | Zeng et al. .................... 359/784 |
| 2007/0279767 A1* | 12/2007 | Murakami et al. ............ 359/791 |
| 2013/0170050 A1 | 7/2013 | Lu et al. |
| 2013/0201380 A1 | 8/2013 | Choi |

(Continued)

FOREIGN PATENT DOCUMENTS

| JP | 200298889 | 4/2002 |
|---|---|---|
| JP | 2003322792 A | 11/2003 |

(Continued)

OTHER PUBLICATIONS

Intellectual Property Office, Ministry of Economic Affairs, R.O.C., "Office Action", Sep. 4, 2014, Taiwan.

*Primary Examiner* — Darryl J Collins
(74) *Attorney, Agent, or Firm* — Locke Lord LLP; Tim Tingkang Xia, Esq.

(57) ABSTRACT

An image capturing lens assembly includes, in order from an object side to an image side, a first lens element, a second lens element and a third lens element. The first lens element with positive refractive power has a convex object-side surface and a convex image-side surface, wherein the surfaces of the first lens element are aspheric. The second lens element with positive refractive power has a concave object-side surface and a convex image-side surface, wherein the surfaces of the second lens element are aspheric. The third lens element with negative refractive power has a concave image-side surface in a paraxial region thereof, wherein the image-side surface of the third lens element has at least one convex shape in an off-axis region thereof, and the surfaces of the third lens element are aspheric. The image capturing lens assembly has a total of three lens elements with refractive power.

23 Claims, 18 Drawing Sheets

(56) References Cited

U.S. PATENT DOCUMENTS

| | | |
|---|---|---|
| 2014/0071522 A1 | 3/2014 | Hsu et al. |
| 2014/0247510 A1 | 9/2014 | Kwon |
| 2015/0002727 A1 | 1/2015 | Chen |
| 2015/0029600 A1 | 1/2015 | Kim et al. |

FOREIGN PATENT DOCUMENTS

| | | |
|---|---|---|
| JP | 2004163849 A | 6/2004 |
| JP | 2004163850 A | 6/2004 |
| JP | 2004302060 A | 10/2004 |
| JP | 2005242286 A | 9/2005 |
| JP | 2005250512 A | 9/2005 |
| JP | 2005250513 A | 9/2005 |
| JP | 2005258467 A | 9/2005 |
| JP | 2007127953 A | 5/2007 |
| JP | 2007127960 A | 5/2007 |
| JP | 2012108230 A | 6/2012 |
| TW | 201115180 A | 5/2011 |
| WO | 2012114970 A1 | 8/2012 |
| WO | 2013048089 A1 | 4/2013 |

* cited by examiner

IMAGE CAPTURING LENS ASSEMBLY, IMAGE CAPTURING DEVICE AND MOBILE TERMINAL

RELATED APPLICATIONS

This application claims priority to Taiwan Application Serial Number 102137700, filed Oct. 18, 2013, which is incorporated by reference herein in its entirety.

BACKGROUND

1. Technical Field

The present disclosure relates to an image capturing lens assembly, image capturing device and mobile. More particularly, the present disclosure relates to a compact image capturing lens assembly and image capturing device applicable to mobile terminals.

2. Description of Related Art

In recent years, with the popularity of mobile products having camera functionalities, the demand of miniaturized optical systems has been increasing. The sensor of a conventional optical system is typically a CCD (Charge-Coupled Device) or a CMOS (Complementary Metal-Oxide-Semiconductor) sensor. As the advanced semiconductor manufacturing technologies have allowed the pixel size of sensors to be reduced and compact optical systems have gradually evolved toward the field of higher megapixels, there is an increasing demand for compact optical systems featuring better image quality.

A conventional optical system with three-element lens structure usually has, in order form an object side to an image side, a positive refractive power, a negative refractive power and a positive refractive power. This type of optical system is also usually with a front aperture stop. However, the image scene tends to be confined by this conventional design of refractive powers and aperture stop. It is also not favorable for making a good balance between enlarging the field of view and reducing the total track length.

SUMMARY

According to one aspect of the present disclosure, an image capturing lens assembly includes, in order from an object side to an image side, a first lens element, a second lens element and a third lens element. The first lens element with positive refractive power has a convex object-side surface and a convex image-side surface, wherein the object-side surface and the image-side surface of the first lens element are aspheric. The second lens element with positive refractive power has a concave object-side surface and a convex image-side surface, wherein the object-side surface and the image-side surface of the second lens element are aspheric. The third lens element with negative refractive power has a concave image-side surface in a paraxial region thereof, wherein the image-side surface of the third lens element has at least one convex shape in an off-axis region thereof, and an object-side surface and the image-side surface of the third lens element are aspheric. The image capturing lens assembly has a total of three lens elements with refractive power and further includes a stop disposed between the first lens element and the second lens element. When a focal length of the image capturing lens assembly is f, a focal length of the second lens element is f2, a focal length of the third lens element is f3, an axial distance between the stop and the image-side surface of the third lens element is SD, an axial distance between the object-side surface of the first lens element and the image-side surface of the third lens element is TD, a central thickness of the first lens element is CT1, a central thickness of the second lens element is CT2, and an entrance pupil diameter of the image capturing lens assembly is EPD, the following conditions are satisfied:

$-3.0 < f2/f3 < 0;$ $0.58 < SD/TD < 0.82;$ $0.20 < CT2/CT1 < 0.85;$ and $1.20 < f/EPD < 2.80.$ According to another aspect of the present disclosure, an image capturing lens assembly includes, in order from an object side to an image side, a first lens element, a second lens element and a third lens element. The first lens element with positive refractive power has a convex object-side surface and a convex image-side surface, wherein the object-side surface and the image-side surface of the first lens element are aspheric. The second lens element with positive refractive power has a concave object-side surface and a convex image-side surface, wherein the object-side surface and the image-side surface of the second lens element are aspheric. The third lens element with negative refractive power has a convex object-side surface and a concave image-side surface in a paraxial region thereof, wherein the image-side surface of the third lens element has at least one convex shape in an off-axis region thereof, and the object-side surface and the image-side surface of the third lens element are aspheric. The image capturing lens assembly has a total of three lens elements with refractive power and further includes a stop disposed between the first lens element and the second lens element. When a focal length of the second lens element is f2, a focal length of the third lens element is f3, an axial distance between the stop and the image-side surface of the third lens element is SD, an axial distance between the object-side surface of the first lens element and the image-side surface of the third lens element is TD, a curvature radius of the object-side surface of the first lens element is R1, and a curvature radius of the image-side surface of the first lens element is R2, the following conditions are satisfied:

$-0.90 < f2/f3 < 0;$ $0.58 < SD/TD < 0.82;$ and $-3.0 < R2/R1 < -0.2.$

According to still another aspect of the present disclosure, an image capturing lens assembly includes, in order from an object side to an image side, a first lens element, a second lens element and a third lens element. The first lens element with positive refractive power has a convex object-side surface and a convex image-side surface, wherein the object-side surface and the image-side surface of the first lens element are aspheric. The second lens element with positive refractive power has a concave object-side surface and a convex image-side surface, wherein the object-side surface and the image-side surface of the second lens element are aspheric. The third lens element with negative refractive power has a convex object-side surface and a concave image-side surface in a paraxial region thereof, wherein the image-side surface of the third lens element has at least one convex shape in an off-axis region thereof, and the object-side surface and the image-side surface of the third lens element are aspheric. The image capturing lens assembly has a total of three lens elements with refractive power and further includes a stop disposed between the first lens element and the second lens element. When a focal length of the second lens element is f2, a focal length of the third lens element is f3, an axial distance between the stop and the image-side surface of the third lens element is SD, an axial distance between the object-side surface of the first lens element and the image-side surface of the third lens element is TD, and an axial distance between the object-side surface of the first lens element and an image plane is TL, the following conditions are satisfied:

$-3.0 < f2/f3 < 0;$ $0.58 < SD/TD < 0.82;$ and $1.0 \text{ mm} < TL < 2.3 \text{ mm}.$ According to yet another aspect of the present disclosure, an image capturing device includes an image capturing lens assembly according to the still another aspect and an image sensor, wherein the image sensor is located on an image plane of the image capturing lens assembly. The image capturing lens assembly includes, in order from an object side to an image side, a first lens element, a second lens element and a third lens element. The first lens element with positive refractive power has a convex object-side surface and a convex image-side surface, wherein the object-side surface and the image-side surface of the first lens element are aspheric. The second lens element with positive refractive power has a concave object-side surface and a convex image-side surface, wherein the object-side surface and the image-side surface of the second lens element are aspheric. The third lens element with negative refractive power has a convex object-side surface and a concave image-side surface in a paraxial region thereof, wherein the image-side surface of the third lens element has at least one convex shape in an off-axis region thereof, and the object-side surface and the image-side surface of the third lens element are aspheric. The image capturing lens assembly has a total of three lens elements with refractive power and further includes a stop disposed between the first lens element and the second lens element. When a focal length of the second lens element is f2, a focal length of the third lens element is f3, an axial distance between the stop and the image-side surface of the third lens element is SD, an axial distance between the object-side surface of the first lens element and the image-side surface of the third lens element is TD, and an axial distance between the object-side surface of the first lens element and an image plane is TL, the following conditions are satisfied:

$-3.0 < f2/f3 < 0;$ $0.58 < SD/TD < 0.82;$ and $1.0 \text{ mm} < TL < 2.3 \text{ mm}.$ According to still yet another aspect of the present disclosure, a mobile terminal includes an image capturing device. The image capturing device includes an image capturing lens assembly according to the still another aspect and an image sensor, wherein the image sensor is located on an image plane of the image capturing lens assembly. The image capturing lens assembly includes, in order from an object side to an image side, a first lens element, a second lens element and a third lens element. The first lens element with positive refractive power has a convex object-side surface and a convex image-side surface, wherein the object-side surface and the image-side surface of the first lens element are aspheric. The second lens element with positive refractive power has a concave object-side surface and a convex image-side surface, wherein the object-side surface and the image-side surface of the second lens element are aspheric. The third lens element with negative refractive power has a convex object-side surface and a concave image-side surface in a paraxial region thereof, wherein the image-side surface of the third lens element has at least one convex shape in an off-axis region thereof, and the object-side surface and the image-side surface of the third lens element are aspheric. The image capturing lens assembly has a total of three lens elements with refractive power and further includes a stop disposed between the first lens element and the second lens element. When a focal length of the second lens element is f2, a focal length of the third lens element is f3, an axial distance between the stop and the image-side surface of the third lens element is SD, an axial distance between the object-side surface of the first lens element and the image-side surface of the third lens element is TD, and an axial distance between the object-side surface of the first lens element and an image plane is TL, the following conditions are satisfied:

$3.0 < f2/f3 < 0;$ $0.58 < SD/TD < 0.82;$ and $1.0 \text{ mm} < TL < 2.3 \text{ mm}.$

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
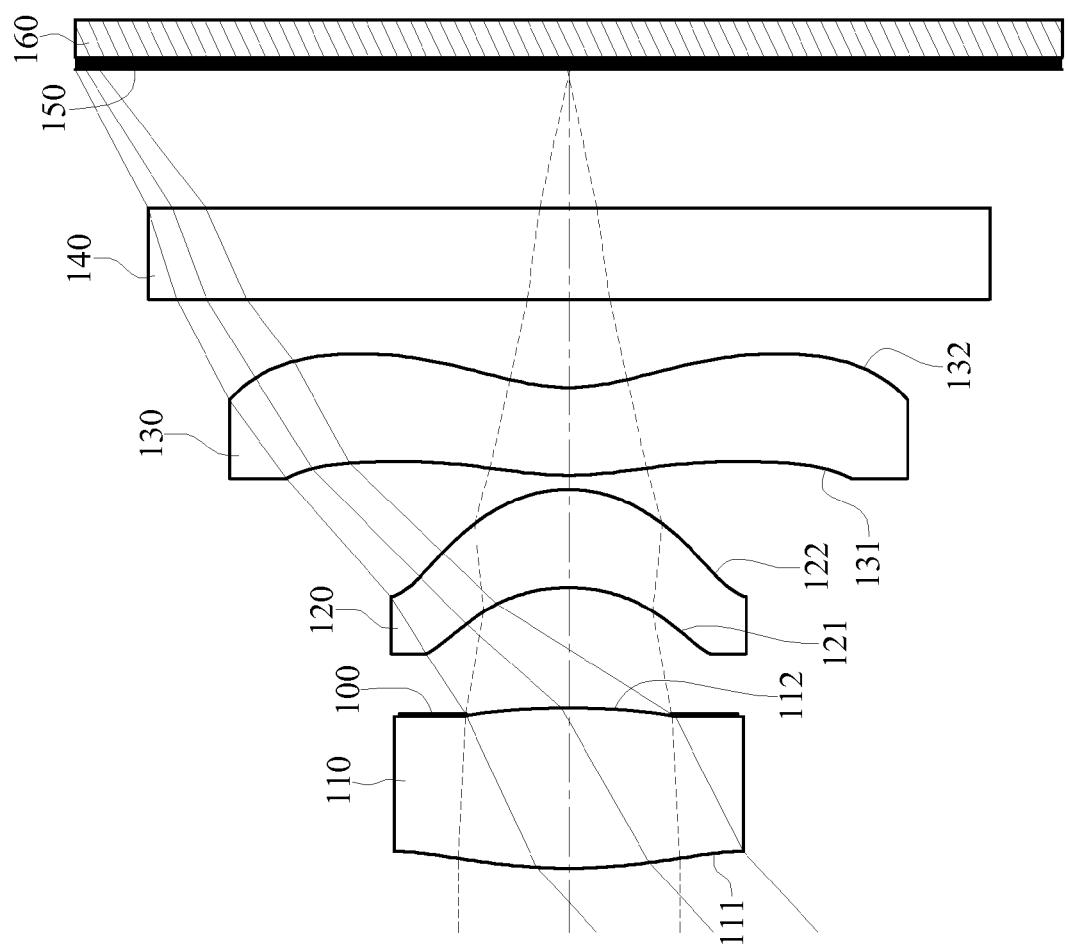
FIG. 1 is a schematic view of an image capturing device according to the 1st embodiment of the present disclosure.

An image capturing lens assembly includes, in order from an object side to an image side, a first lens element, a second lens element and a third lens element. The image capturing lens assembly has a total of three lens elements with refractive power.

The first lens element has positive refractive power, so that it is favorable for effectively reducing the total track length of the image capturing lens assembly. The first lens element has a convex object-side surface and a convex image-side surface, so that it is favorable for further reducing the total track length so as to keep a compact size.

The second lens element has positive refractive power, so that it is favorable for reducing the photosensitivity of the image capturing lens assembly. The second lens element has a concave object-side surface and a convex image-side surface, so that it is favorable for correcting astigmatism.

The third lens element has negative refractive power, so that it is favorable for correcting the aberrations. The third lens element can have a convex object-side surface and has a concave image-side surface in a paraxial region thereof, wherein the image-side surface of the third lens element has at least one convex shape in an off-axis region thereof. Therefore, it is favorable for correcting the astigmatism and further correcting the aberrations of the off-axis.

When a focal length of the second lens element is f2, and a focal length of the third lens element is f3, the following condition is satisfied: $-3.0<f2/f3<0$. Therefore, it is favorable for further reducing the total track length of the image capturing lens assembly effectively. Preferably, the following condition is satisfied: $-1.5<f2/f3<0$. More preferably, the following condition is satisfied: $-0.90<f2/f3<0$.

When an axial distance between a stop and the image-side surface of the third lens element is SD, and an axial distance between the object-side surface of the first lens element and the image-side surface of the third lens element is TD, the following condition is satisfied: $0.58<SD/TD<0.82$. Therefore, the stop is close to the image plane which is favorable for increasing the field of view so as to obtain more of the image scene under a limited distance.

When a central thickness of the first lens element is CT1, and a central thickness of the second lens element is CT2, the following condition is satisfied: $0.20<CT2/CT1<0.85$. Therefore, it is favorable for assembling the lens elements and increasing the manufacturing yield rate. Preferably, the following condition is satisfied: $0.30<CT2/CT1<0.75$.

When a focal length of the image capturing lens assembly is f, and an entrance pupil diameter of the image capturing lens assembly is EPD, the following condition is satisfied: $1.20<f/EPD<2.80$. Therefore, it is favorable for increasing exposure so as to improve image resolving power. Preferably, the following condition is satisfied: $1.60<f/EPD<2.45$.

When a curvature radius of the object-side surface of the first lens element is R1, and a curvature radius of the image-side surface of the first lens element is R2, the following condition is satisfied: $-3.0<R2/R1<-0.2$. Therefore, it is favorable for correcting spherical aberration. Preferably, the following condition is satisfied: $-2.0<R2/R1<-0.2$.

When an axial distance between the object-side surface of the first lens element and an image plane is TL, the following condition is satisfied: $1.0\ mm<TL<2.3\ mm$. Therefore, it is favorable for keeping the image capturing lens assembly compact so as to be applied to mobile terminals. Preferably, the following condition is satisfied: $1.0\ mm<TL<2.0\ mm$.

When a maximal field of view of the image capturing lens assembly is FOV, the following condition is satisfied: $76\ degrees<FOV<120\ degrees$. Therefore, it is favorable for enlarging the field of view so as to obtain more of the image scene.

When a curvature radius of the object-side surface of the third lens element is R5, and a curvature radius of the image-side surface of the third lens element is R6, the following condition is satisfied: $|(R5-R6)/(R5+R6)|<0.35$. Therefore, it is favorable for correcting aberrations. Preferably, the following condition is satisfied: $|(R5-R6)/(R5+R6)|<0.25$.

When the focal length of the image capturing lens assembly is f, and the focal length of the second lens element is f2, the following condition is satisfied: $0.4<f/f2<1.0$. Therefore, it is favorable for reducing photosensitivity.

When a curvature radius of the object-side surface of the second lens element is R3, and a curvature radius of the image-side surface of the second lens element is R4, the following condition is satisfied: $|(R3-R4)/(R3+R4)|<0.15$. Therefore, it is favorable for correcting the astigmatism.

When the axial distance between the object-side surface of the first lens element and the image plane is TL, and a maximum image height of the image capturing lens assembly (half of a diagonal length of an effective photosensitive area of an image sensor) is ImgH, the following condition is satisfied: $TL/ImgH<1.90$. Therefore, it is favorable for keeping the image capturing lens assembly compact so as to be applied to compact mobile terminals.

When the axial distance between the object-side surface of the first lens element and the image plane is TL, and half of the maximal field of view of the image capturing lens assembly is HFOV, the following condition is satisfied: $1.0\ mm<TL/\tan(HFOV)<3.0\ mm$. Therefore, it is favorable for keeping the image capturing lens assembly compact and obtaining a proper field of view.

According to the image capturing lens assembly of the present disclosure, the lens elements thereof can be made of glass or plastic material. When the lens elements are made of glass material, the distribution of the refractive power of the image capturing lens assembly may be more flexible to design. When the lens elements are made of plastic material, the manufacturing cost can be effectively reduced. Furthermore, surfaces of each lens element can be arranged to be aspheric, since the aspheric surface of the lens element is easy to form a shape other than spherical surface so as to have more controllable variables for eliminating the aberration thereof, and to further decrease the required number of the lens elements. Therefore, the total track length of the image capturing lens assembly can also be reduced.

According to the image capturing lens assembly of the present disclosure, each of an object-side surface and an image-side surface has a paraxial region and an off-axis region. The paraxial region refers to the region of the surface where light rays travel close to the optical axis, and the off-axis region refers to the region of the surface where light rays travel away from the optical axis. Particularly, when the lens element has a convex surface, it indicates that the surface is convex in the paraxial region thereof; when the lens element has a concave surface, it indicates that the surface is concave in the paraxial region thereof.

According to the image capturing lens assembly of the present disclosure, the image capturing lens assembly can include at least one stop, such as an aperture stop, a glare stop or a field stop. Said glare stop or said field stop is for eliminating the stray light and thereby improving the image resolution thereof.

According to the image capturing lens assembly of the present disclosure, an aperture stop can be configured as a middle stop. A middle stop disposed between the first lens element and the second lens element is favorable for enlarging the field of view of the image capturing lens assembly and thereby provides a wider field of view for the same.

The present image capturing lens assembly can be optionally applied to moving focus or zoom optical systems. According to the image capturing lens assembly of the present disclosure, the image capturing lens assembly is featured with good correction ability and high image quality, and can be applied to 3D (three-dimensional) image capturing applications, in products such as digital cameras, mobile devices, digital tablets, wearable devices and other mobile terminals.

According to the present disclosure, an image capturing device is provided. The image capturing device includes the image capturing lens assembly according to the aforementioned image capturing lens assembly of the present disclosure, and an image sensor, wherein the image sensor is disposed on an image plane of the aforementioned image capturing lens assembly. It is favorable for reducing the total track length so as to keep a compact size. Furthermore, the stop can be close to the image plane which is favorable for increasing the field of view so as to obtain more of the image scene under a limited distance. Preferably, the image capturing device can further include a barrel member and/or a holding member.

Figure 18:
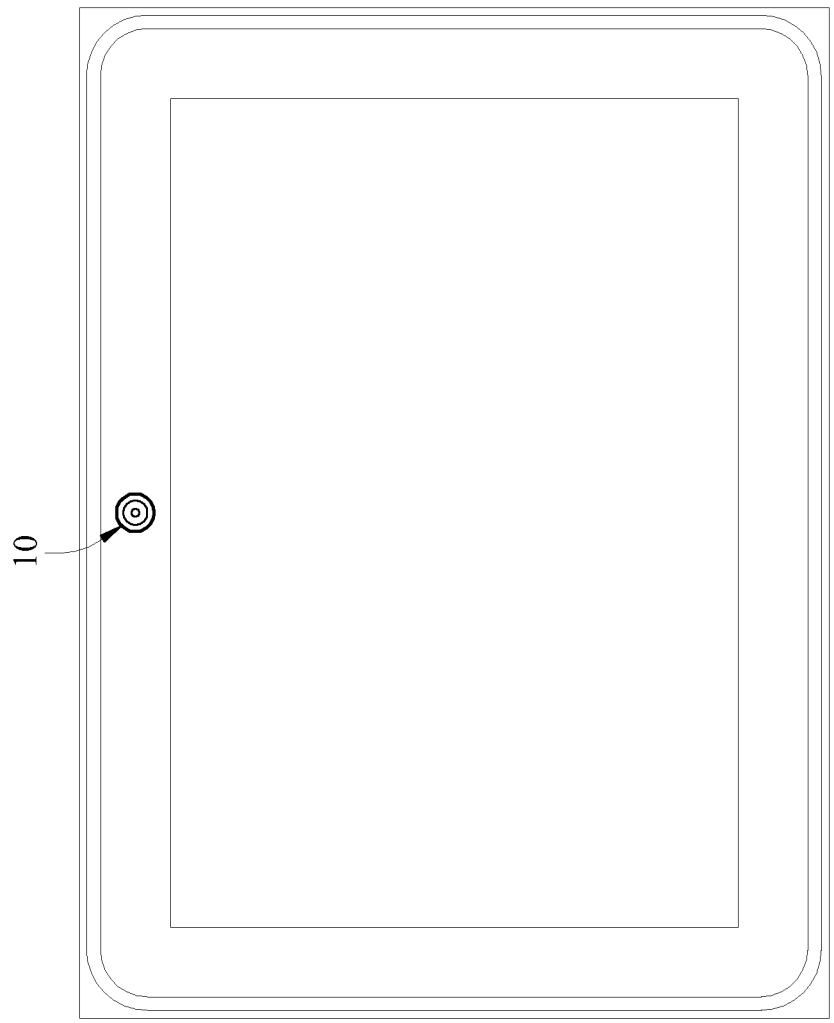
FIG. 18 shows a tablet personal computer with an image capturing device of the present disclosure installed therein.
Figure 17:
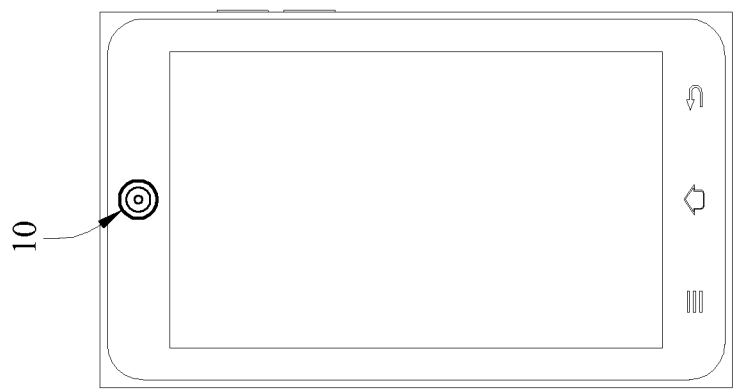
FIG. 17 shows a smart phone with an image capturing device of the present disclosure installed therein.
Figure 19:
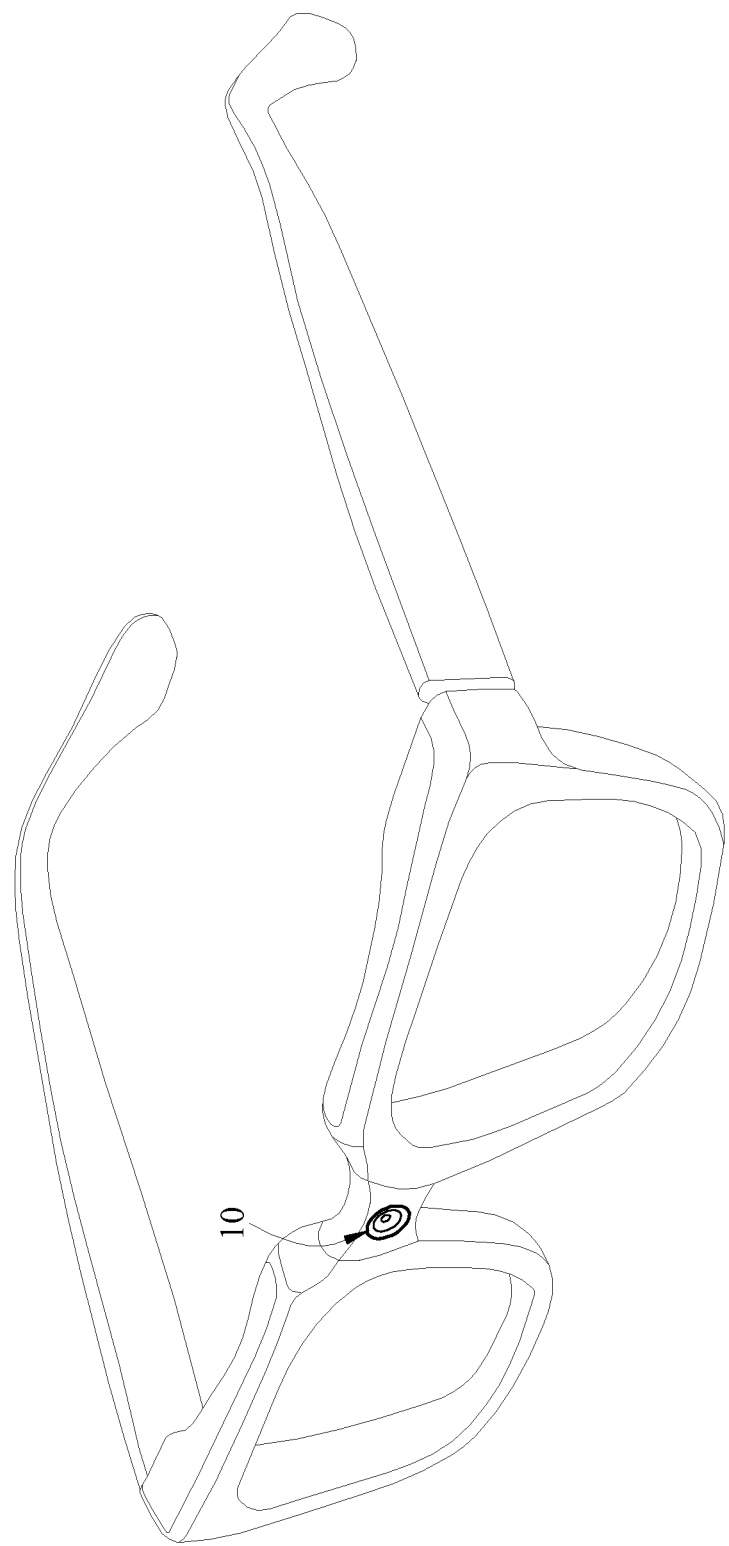
FIG. 19 shows a wearable device with an image capturing device of the present disclosure installed therein.

According to the present disclosure, a mobile terminal is provided, wherein the mobile terminal includes an image capturing device. In FIGS. 17-19, the image capturing device 10 can be applied to a smart phone (as shown in FIG. 17), a tablet personal computer (as shown in FIG. 18) or a wearable device (as shown in FIG. 19). It is favorable for reducing the total track length so as to keep a compact size. Furthermore, the stop can be close to the image plane which is favorable for increasing the field of view so as to obtain more of the image scene under a limited distance. Preferably, the mobile terminal can further include but not limited to display, control unit, random access memory unit (RAM) and/or read only memory unit (ROM).

According to the above description of the present disclosure, the following 1st-8th specific embodiments are provided for further explanation.

1st Embodiment

Figure 2:
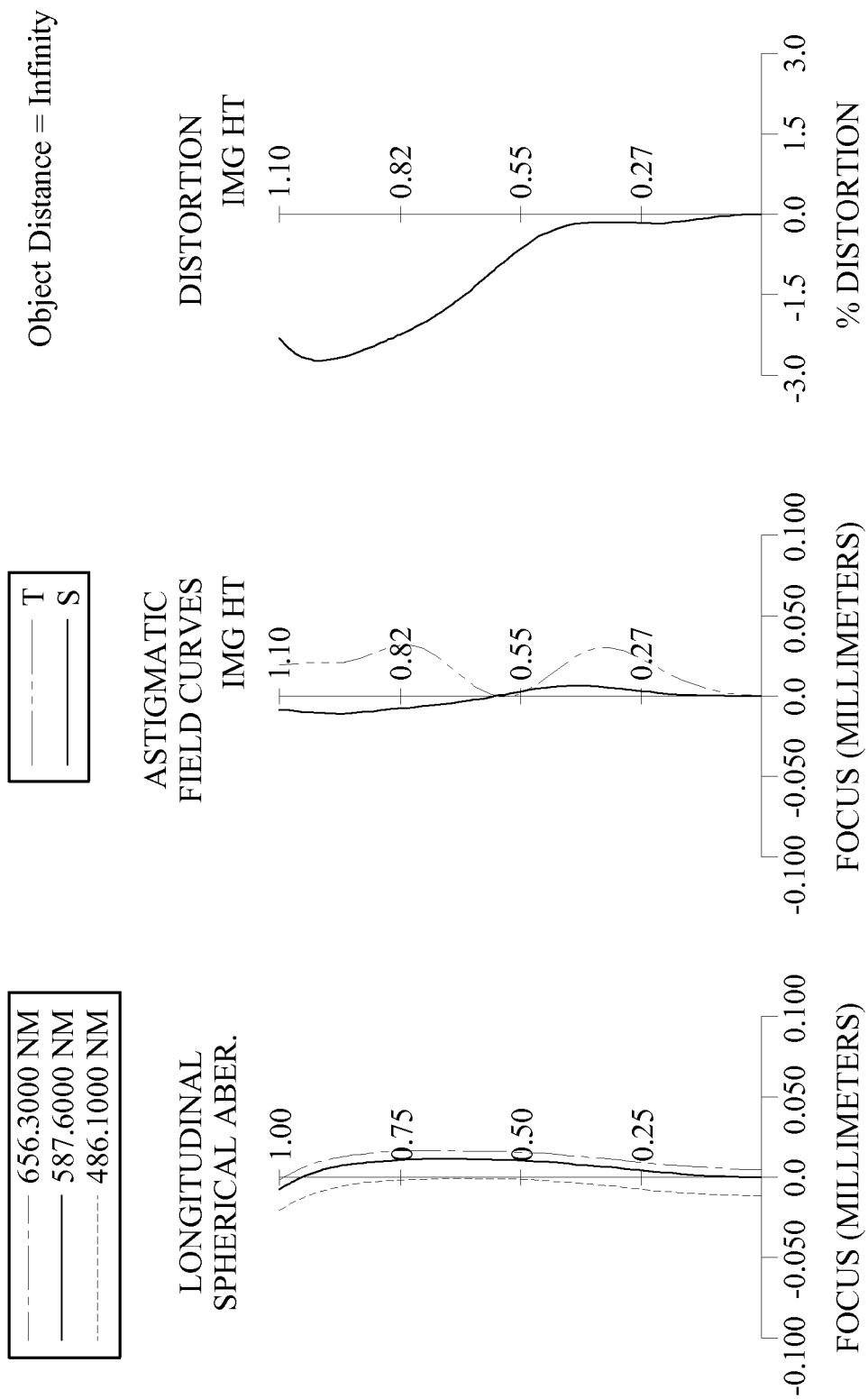
FIG. 2 shows spherical aberration curves, astigmatic field curves and a distortion curve of the image capturing device according to the 1st embodiment.

FIG. 1 is a schematic view of an image capturing device according to the 1st embodiment of the present disclosure. FIG. 2 shows, in order from left to right, spherical aberration curves, astigmatic field curves and a distortion curve of the image capturing device according to the 1st embodiment.

In FIG. 1, the image capturing device includes the image capturing lens assembly (not otherwise herein labeled) of the present disclosure and an image sensor 160. The image capturing lens assembly includes, in order from an object side to an image side, a first lens element 110, an aperture stop 100, a second lens element 120, a third lens element 130, an IR-cut filter 140 and an image plane 150, wherein the image capturing lens assembly has a total of three lens elements (110-130) with refractive power.

The first lens element 110 with positive refractive power has a convex object-side surface 111 and a convex image-side surface 112, which are both aspheric, and the first lens element 110 is made of plastic material.

The second lens element 120 with positive refractive power has a concave object-side surface 121 and a convex image-side surface 122, which are both aspheric, and the second lens element 120 is made of plastic material.

The third lens element 130 with negative refractive power has a convex object-side surface 131 in a paraxial region thereof and a concave image-side surface 132 in a paraxial region thereof, which are both aspheric, and the third lens element 130 is made of plastic material. Moreover, the object-side surface 131 of the third lens element 130 has at least one concave shape in an off-axis region thereof, and the image-side surface 132 of the third lens element 130 has at least one convex shape in an off-axis region thereof.

The IR-cut filter 140 is made of glass and located between the third lens element 130 and the image plane 150, and will not affect the focal length of the image capturing lens assembly. The image sensor 160 is disposed on the image plane 150 of the image capturing lens assembly.

The equation of the aspheric surface profiles of the aforementioned lens elements of the 1st embodiment is expressed as follows:

$$X(Y) = (Y^2/R)/(1 + sqrt(1 - (1+k) \times (Y/R)^2)) + \sum_i (Ai) \times (Y^i),$$

where,

X is the relative distance between a point on the aspheric surface spaced at a distance Y from the optical axis and the tangential plane at the aspheric surface vertex on the optical axis;

Y is the vertical distance from the point on the aspheric surface to the optical axis;

R is the curvature radius;

k is the conic coefficient; and

Ai is the i-th aspheric coefficient.

In the image capturing lens assembly according to the 1st embodiment, when a focal length of the image capturing lens assembly is f, an f-number of the image capturing lens assembly is Fno, and half of a maximal field of view of the image capturing lens assembly is HFOV, these parameters have the following values: f=1.21 mm; Fno=2.40; and HFOV=42.8 degrees.

In the image capturing lens assembly according to the 1st embodiment, when a central thickness of the first lens element 110 is CT1, and a central thickness of the second lens element 120 is CT2, the following condition is satisfied: CT2/CT1=0.61.

In the image capturing lens assembly according to the 1st embodiment, when a curvature radius of the object-side surface 111 of the first lens element 110 is R1, a curvature radius of the image-side surface 112 of the first lens element 110 is R2, the following condition is satisfied: R2/R1=−1.48.

In the image capturing lens assembly according to the 1st embodiment, when a curvature radius of the object-side surface 121 of the second lens element 120 is R3, and a curvature radius of the image-side surface 122 of the second lens element 120 is R4, the following condition is satisfied:

|(R3−R4)/(R3+R4)|=0.11.

In the image capturing lens assembly according to the 1st embodiment, when a curvature radius of the object-side surface 131 of the third lens element 130 is R5, and a curvature radius of the image-side surface 132 of the third lens element 130 is R6, the following condition is satisfied: |(R5−R6)/(R5+R6)|=0.31.

In the image capturing lens assembly according to the 1st embodiment, when the focal length of the image capturing lens assembly is f, and a focal length of the second lens element 120 is f2, the following condition is satisfied: f/f2=0.95.

In the image capturing lens assembly according to the 1st embodiment, when the focal length of the second lens element 120 is f2, and a focal length of the third lens element 130 is f3, the following condition is satisfied: f2/f3=−0.74.

In the image capturing lens assembly according to the 1st embodiment, when the focal length of the image capturing lens assembly is f, and an entrance pupil diameter of the image capturing lens assembly is EPD, the following condition is satisfied: f/EPD=2.40.

In the image capturing lens assembly according to the 1st embodiment, when an axial distance between the aperture stop 100 and the image-side surface 132 of the third lens element 130 is SD, and an axial distance between the object-side surface 111 of the first lens element 110 and the image-side surface 132 of the third lens element 130 is TD, the following condition is satisfied: SD/TD=0.68.

In the image capturing lens assembly according to the 1st embodiment, when an axial distance between the object-side surface 111 of the first lens element 110 and the image plane 150 is TL, the following condition is satisfied: TL=1.82 mm.

In the image capturing lens assembly according to the 1st embodiment, when the maximal field of view of the image capturing lens assembly is FOV, the following condition is satisfied: FOV=85.6 degrees.

In the image capturing lens assembly according to the 1st embodiment, when the axial distance between the object-side surface 111 of the first lens element 110 and the image plane 150 is TL, and half of the maximal field of view of the image capturing lens assembly is HFOV, the following condition is satisfied: TL/tan(HFOV)=1.97 mm.

In the image capturing lens assembly according to the 1st embodiment, when the axial distance between the object-side surface 111 of the first lens element 110 and the image plane 150 is TL, and a maximum image height of the image capturing lens assembly (half of a diagonal length of an effective photosensitive area of the image sensor 160) is ImgH, the following condition is satisfied: TL/ImgH=1.66.

The detailed optical data of the 1st embodiment are shown in Table 1 and the aspheric surface data are shown in Table 2 below.

TABLE 1

1st Embodiment
f = 1.21 mm, Fno = 2.40, HFOV = 42.8 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 1.261 | ASP | 0.366 | Plastic | 1.535 | 56.3 | 1.47 |
| 2 | | −1.867 | ASP | −0.014 | | | | |
| 3 | Ape. Stop | Plano | | 0.288 | | | | |
| 4 | Lens 2 | −0.359 | ASP | 0.224 | Plastic | 1.544 | 55.9 | 1.28 |
| 5 | | −0.289 | ASP | 0.032 | | | | |
| 6 | Lens 3 | 0.790 | ASP | 0.200 | Plastic | 1.632 | 23.4 | −1.74 |
| 7 | | 0.414 | ASP | 0.200 | | | | |
| 8 | IR-cut filter | Plano | | 0.210 | Glass | 1.517 | 64.2 | — |
| 9 | | Plano | | 0.316 | | | | |
| 10 | Image | Plano | | — | | | | |

Note:
Reference wavelength is 587.6 nm (d-line).

TABLE 2

| Aspheric Coefficients | | | |
|---|---|---|---|
| Surface # | 1 | 2 | 4 |
| k = | 4.8360E+00 | 1.8616E+01 | −3.2555E+00 |
| A4 = | −1.1002E+00 | −5.5725E−01 | −6.6979E+00 |
| A6 = | 1.0455E−01 | −8.8597E+00 | −1.1550E+01 |
| A8 = | −1.6045E+01 | 1.2150E+02 | −6.9606E+02 |
| A10 = | — | — | 2.0016E+04 |
| A12 = | — | — | −9.4560E+04 |
| Surface # | 5 | 6 | 7 |
| k = | −3.3149E+00 | −9.9668E−01 | −7.5252E+00 |
| A4 = | −1.0013E+01 | −5.0461E+00 | −1.8150E+00 |
| A6 = | 9.4283E+01 | 2.1423E+01 | 4.3915E+00 |
| A8 = | −1.2697E+03 | −5.4967E+01 | −5.9887E+00 |
| A10 = | 9.6278E+03 | 8.3535E+01 | 2.3408E+00 |
| A12 = | −2.2990E+04 | −7.9954E+01 | 1.9759E+00 |
| A14 = | — | 3.6659E+01 | −2.5290E+00 |

In Table 1, the curvature radius, the thickness and the focal length are shown in millimeters (mm). Surface numbers 0-10 represent the surfaces sequentially arranged from the object-side to the image-side along the optical axis. In Table 2, k represents the conic coefficient of the equation of the aspheric surface profiles. A4-A14 represent the aspheric coefficients ranging from the 4th order to the 14th order. This information related to Table 1 and Table 2 applies also to the Tables for the remaining embodiments, and so an explanation in this regard will not be provided again.

2nd Embodiment

Figure 3:
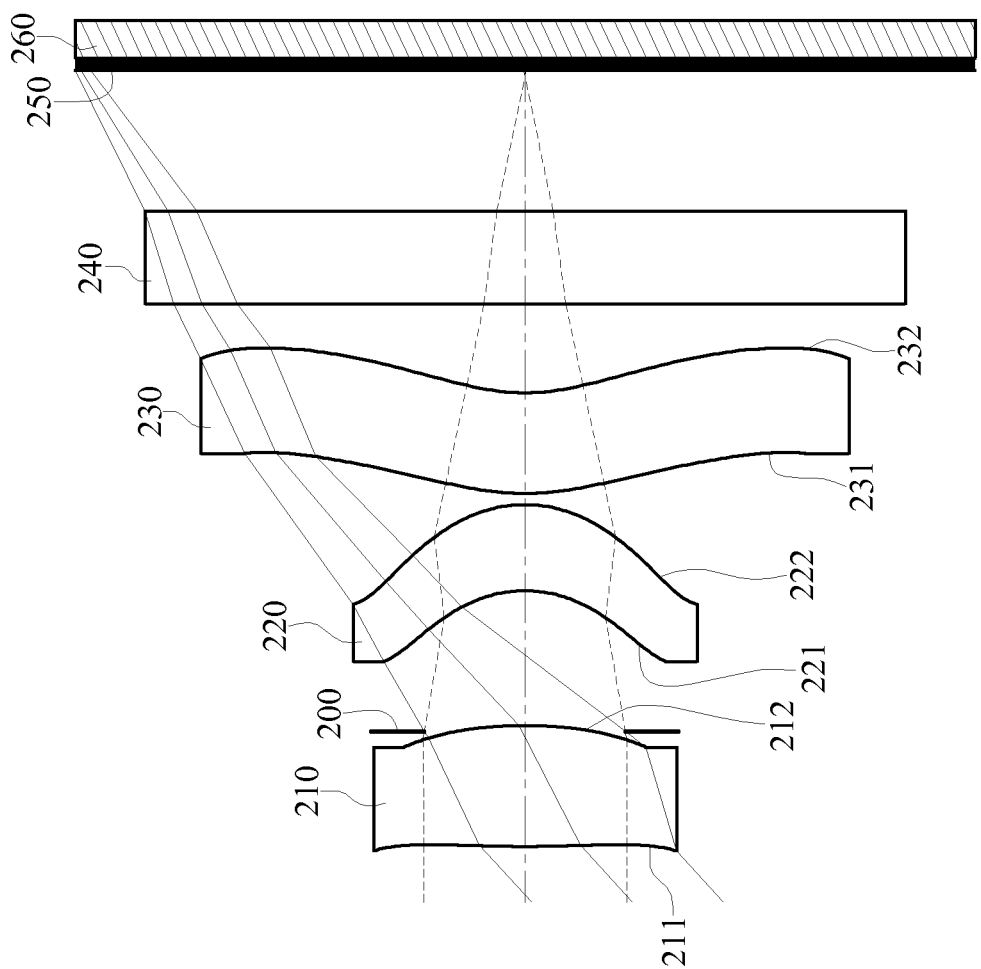
FIG. 3 is a schematic view of an image capturing device according to the 2nd embodiment of the present disclosure.
Figure 4:
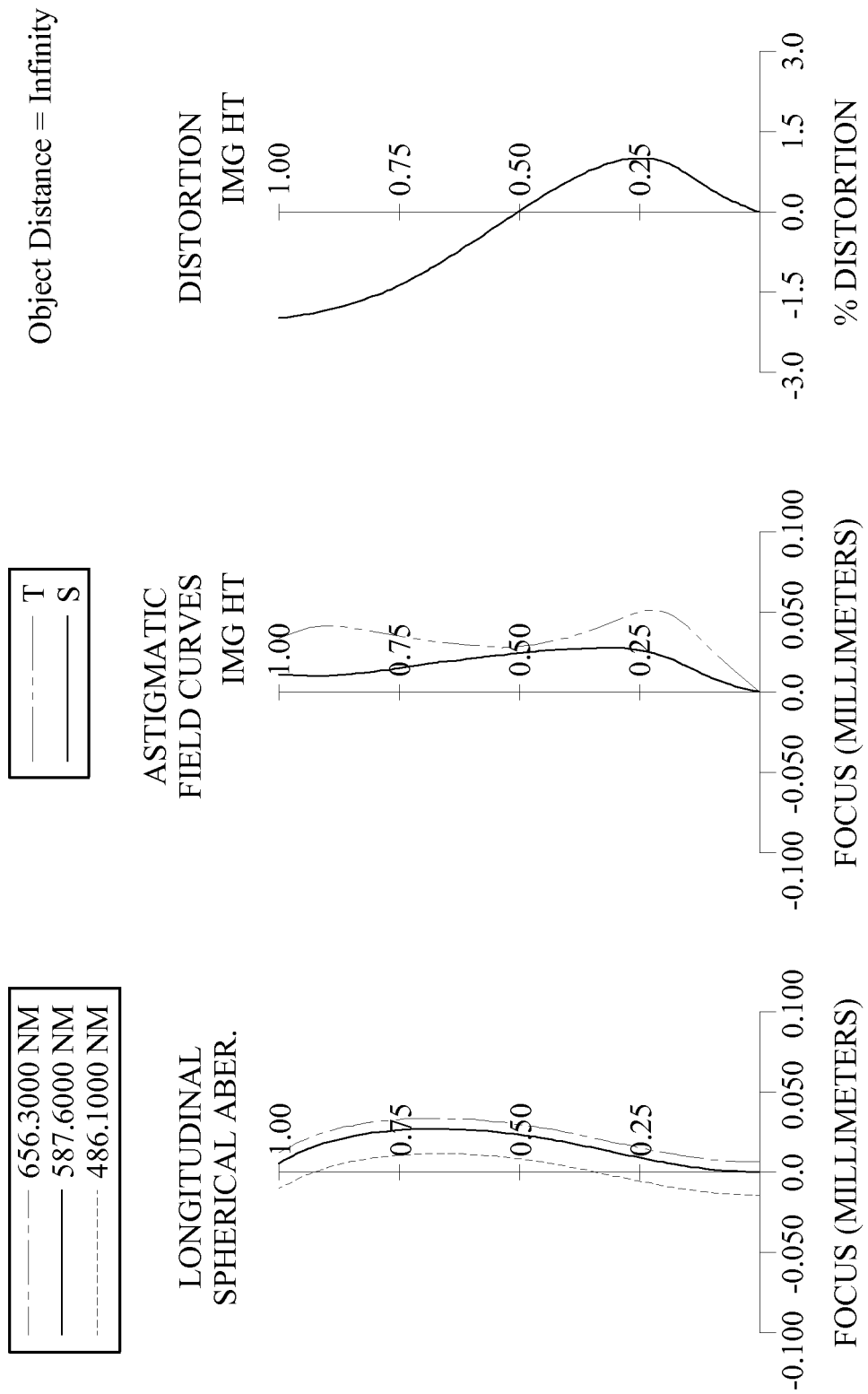
FIG. 4 shows spherical aberration curves, astigmatic field curves and a distortion curve of the image capturing device according to the 2nd embodiment.

FIG. 3 is a schematic view of an image capturing device according to the 2nd embodiment of the present disclosure. FIG. 4 shows, in order from left to right, spherical aberration curves, astigmatic field curves and a distortion curve of the image capturing device according to the 2nd embodiment.

In FIG. 3, the image capturing device includes the image capturing lens assembly (not otherwise herein labeled) of the present disclosure and an image sensor 260. The image capturing lens assembly includes, in order from an object side to an image side, a first lens element 210, an aperture stop 200, a second lens element 220, a third lens element 230, an IR-cut filter 240 and an image plane 250, wherein the image capturing lens assembly has a total of three lens elements (210-230) with refractive power.

The first lens element 210 with positive refractive power has a convex object-side surface 211 and a convex image-side surface 212, which are both aspheric, and the first lens element 210 is made of plastic material.

The second lens element 220 with positive refractive power has a concave object-side surface 221 and a convex image-side surface 222, which are both aspheric, and the second lens element 220 is made of plastic material.

The third lens element 230 with negative refractive power has a convex object-side surface 231 in a paraxial region thereof and a concave image-side surface 232 in a paraxial region thereof, which are both aspheric, and the third lens element 230 is made of plastic material. Moreover, the object-side surface 231 of the third lens element 230 has at least one concave shape in an off-axis region thereof, and the image-side surface 232 of the third lens element 230 has at least one convex shape in an off-axis region thereof.

The IR-cut filter 240 is made of glass and located between the third lens element 230 and the image plane 250, and will not affect the focal length of the image capturing lens assembly. The image sensor 260 is disposed on the image plane 250 of the image capturing lens assembly.

The detailed optical data of the 2nd embodiment are shown in Table 3 and the aspheric surface data are shown in Table 4 below.

TABLE 3

2nd Embodiment
f = 1.10 mm, Fno = 2.40, HFOV = 42.6 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 2.850 | ASP | 0.273 | Plastic | 1.535 | 55.7 | 1.37 |
| 2 | | −0.950 | ASP | −0.014 | | | | |
| 3 | Ape. Stop | Plano | | 0.317 | | | | |
| 4 | Lens 2 | −0.269 | ASP | 0.194 | Plastic | 1.530 | 55.8 | 2.55 |
| 5 | | −0.280 | ASP | 0.025 | | | | |
| 6 | Lens 3 | 0.583 | ASP | 0.227 | Plastic | 1.543 | 56.5 | −9.65 |
| 7 | | 0.453 | ASP | 0.200 | | | | |
| 8 | IR-cut filter | Plano | | 0.210 | Glass | 1.517 | 64.2 | — |
| 9 | | Plano | | 0.317 | | | | |
| 10 | Image | Plano | | — | | | | |

Note:
Reference wavelength is 587.6 nm (d-line).

TABLE 4

Aspheric Coefficients

| Surface # | 1 | 2 | 4 |
|---|---|---|---|
| k = | −9.0000E+01 | 1.2854E+00 | −2.2784E+00 |
| A4 = | −1.2880E+00 | −1.7043E+00 | −6.3308E+00 |
| A6 = | −2.3330E+00 | 4.4927E+00 | −2.5192E+00 |
| A8 = | −3.5006E+01 | −8.5048E+00 | −3.5717E+02 |
| A10 = | — | — | 1.7561E+04 |
| A12 = | — | — | −9.4560E+04 |

| Surface # | 5 | 6 | 7 |
|---|---|---|---|
| k = | −3.5621E+00 | −1.6507E+00 | −6.6831E+00 |
| A4 = | −1.1946E+01 | −4.2389E+00 | −1.4062E+00 |
| A6 = | 1.0824E+02 | 1.9340E+01 | 3.7828E+00 |
| A8 = | −1.1616E+03 | −5.4668E+01 | −5.4794E+00 |
| A10 = | 9.0021E+03 | 8.9851E+01 | 1.5150E+00 |
| A12 = | −2.2990E+04 | −8.1882E+01 | 3.4034E+00 |
| A14 = | — | 3.0924E+01 | −2.8318E+00 |

In the image capturing lens assembly according to the 2nd embodiment, the definitions of these parameters shown in the following table are the same as those stated in the 1st embodiment with corresponding values for the 2nd embodiment. Moreover, these parameters can be calculated from Table 3 and Table 4 as the following values and satisfy the following conditions:

| 2nd Embodiment | | | |
|---|---|---|---|
| f [mm] | 1.10 | f2/f3 | −0.26 |
| Fno | 2.40 | f/EPD | 2.40 |
| HFOV [deg.] | 42.6 | SD/TD | 0.75 |
| CT2/CT1 | 0.71 | TL [mm] | 1.75 |
| R2/R1 | −0.33 | FOV [deg.] | 85.2 |
| |(R3 − R4)/(R3 + R4)| | 0.02 | TL/tan(HFOV) [mm] | 1.90 |
| |(R5 − R6)/(R5 + R6)| | 0.13 | TL/ImgH | 1.75 |
| f/f2 | 0.43 | | |

3rd Embodiment

Figure 5:
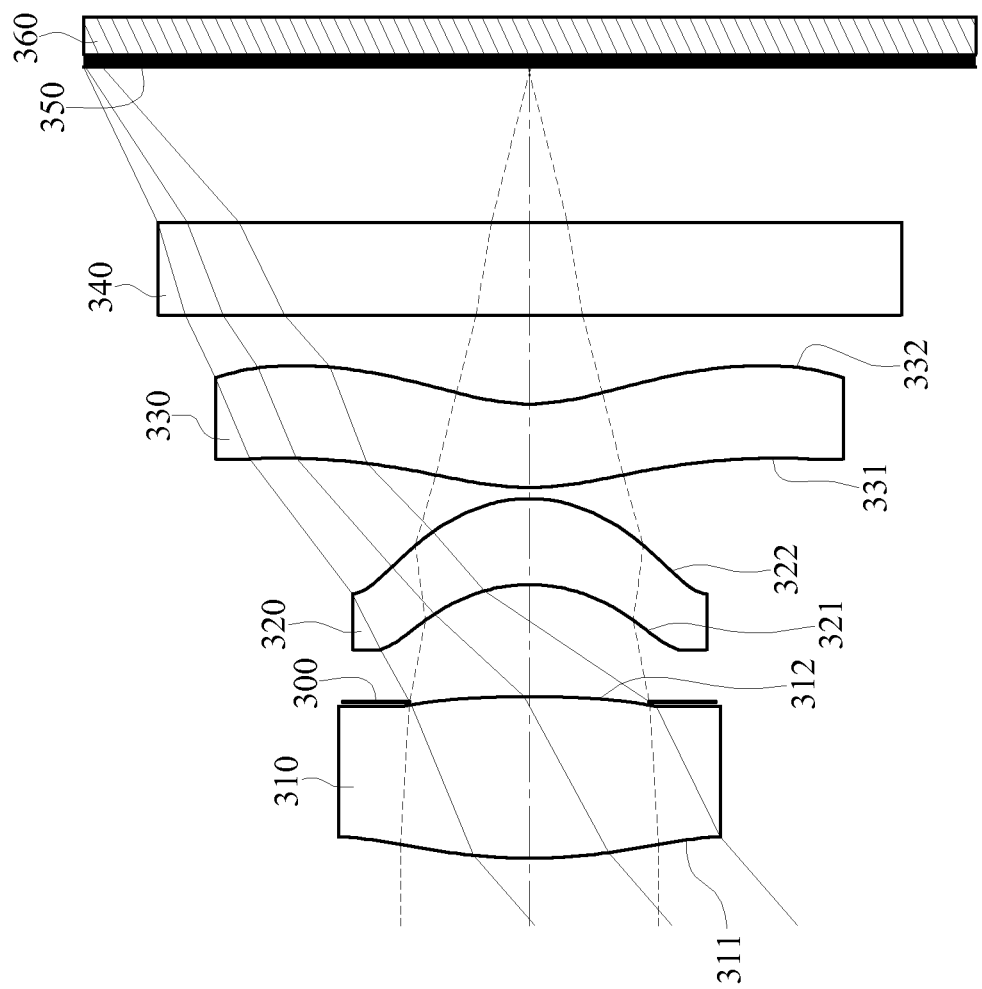
FIG. 5 is a schematic view of an image capturing device according to the 3rd embodiment of the present disclosure.
Figure 6:
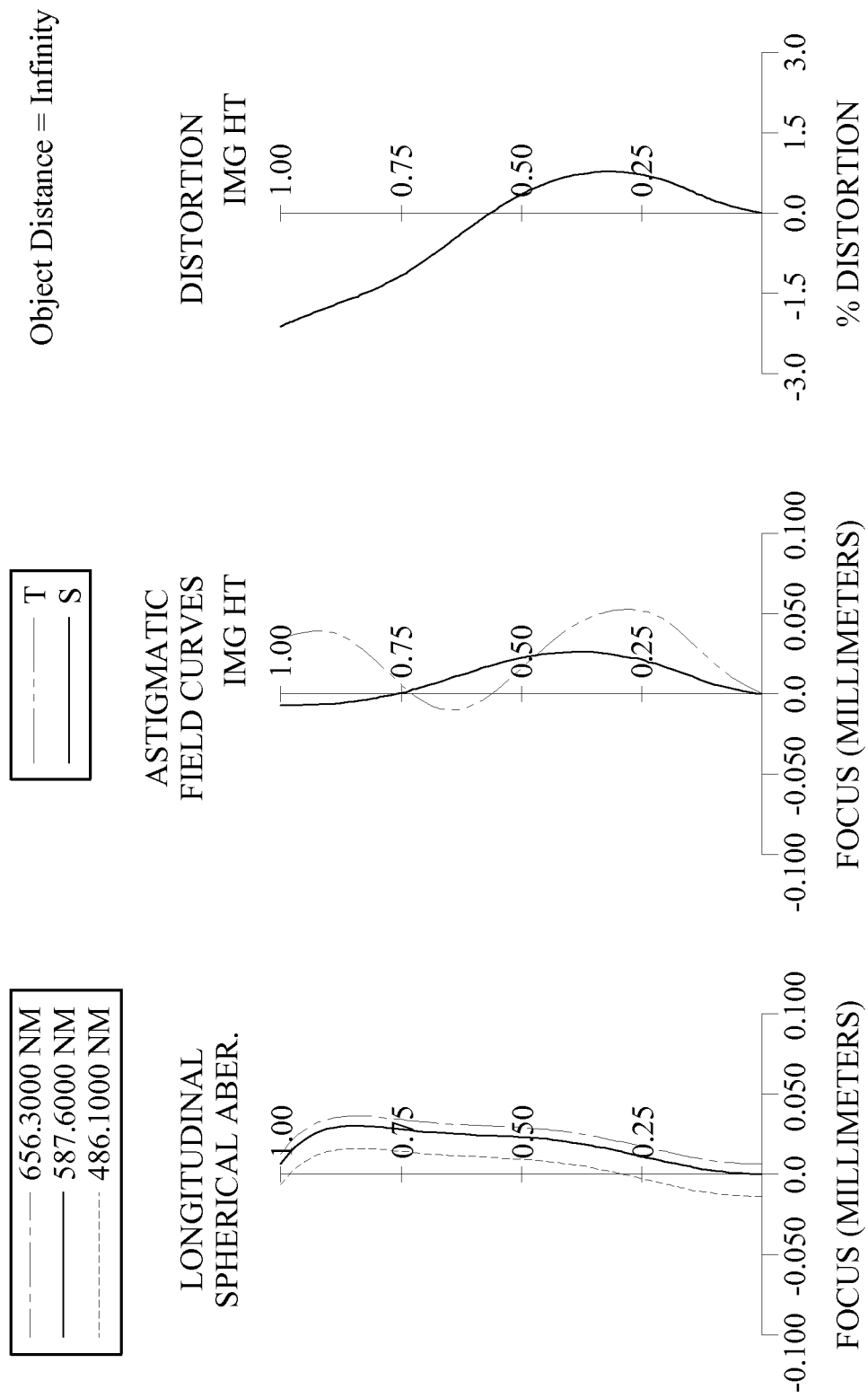
FIG. 6 shows spherical aberration curves, astigmatic field curves and a distortion curve of the image capturing device according to the 3rd embodiment.

FIG. 5 is a schematic view of an image capturing device according to the 3rd embodiment of the present disclosure. FIG. 6 shows, in order from left to right, spherical aberration curves, astigmatic field curves and a distortion curve of the image capturing device according to the 3rd embodiment.

In FIG. 5, the image capturing device includes the image capturing lens assembly (not otherwise herein labeled) of the present disclosure and an image sensor 360. The image capturing lens assembly includes, in order from an object side to an image side, a first lens element 310, an aperture stop 300, a second lens element 320, a third lens element 330, an IR-cut filter 340 and an image plane 350, wherein the image capturing lens assembly has a total of three lens elements (310-330) with refractive power.

The first lens element 310 with positive refractive power has a convex object-side surface 311 and a convex image-side surface 312, which are both aspheric, and the first lens element 310 is made of plastic material.

The second lens element 320 with positive refractive power has a concave object-side surface 321 and a convex image-side surface 322, which are both aspheric, and the second lens element 320 is made of plastic material.

The third lens element 330 with negative refractive power has a convex object-side surface 331 in a paraxial region thereof and a concave image-side surface 332 in a paraxial region thereof, which are both aspheric, and the third lens element 330 is made of plastic material. Moreover, the object-side surface 331 of the third lens element 330 has at least one concave shape in an off-axis region thereof, and the image-side surface 332 of the third lens element 330 has at least one convex shape in an off-axis region thereof.

The IR-cut filter 340 is made of glass and located between the third lens element 330 and the image plane 350, and will not affect the focal length of the image capturing lens assembly. The image sensor 360 is disposed on the image plane 350 of the image capturing lens assembly.

The detailed optical data of the 3rd embodiment are shown in Table 5 and the aspheric surface data are shown in Table 6 below.

TABLE 5

3rd Embodiment
f = 1.16 mm, Fno = 2.00, HFOV = 41.0 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 1.198 | ASP | 0.365 | Plastic | 1.544 | 55.9 | 1.55 |
| 2 | | −2.548 | ASP | −0.012 | | | | |
| 3 | Ape. Stop | Plano | | 0.264 | | | | |
| 4 | Lens 2 | −0.340 | ASP | 0.194 | Plastic | 1.544 | 55.9 | 1.78 |
| 5 | | −0.302 | ASP | 0.025 | | | | |
| 6 | Lens 3 | 0.612 | ASP | 0.188 | Plastic | 1.650 | 21.4 | −3.81 |
| 7 | | 0.431 | ASP | 0.200 | | | | |
| 8 | IR-cut filter | Plano | | 0.210 | Glass | 1.517 | 64.2 | — |
| 9 | | Plano | | 0.350 | | | | |
| 10 | Image | Plano | | — | | | | |

Note:
Reference wavelength is 587.6 nm (d-line).

TABLE 6

Aspheric Coefficients

| Surface # | 1 | 2 | 4 |
|---|---|---|---|
| k = | 3.8272E+00 | 1.0821E+00 | −2.5999E+00 |
| A4 = | −9.8411E−01 | −8.8268E−01 | −1.6553E+00 |
| A6 = | −4.7804E−01 | −7.3306E+00 | −3.4803E+01 |
| A8 = | −8.8081E+00 | 7.9430E+01 | −1.0526E+03 |
| A10 = | — | — | 2.2780E+04 |
| A12 = | — | — | −9.4560E+04 |

| Surface # | 5 | 6 | 7 |
|---|---|---|---|
| k = | −3.9950E+00 | −1.4796E+00 | −7.3194E+00 |
| A4 = | −9.2922E+00 | −4.8511E+00 | −1.5871E+00 |
| A6 = | 9.4768E+01 | 2.0893E+01 | 4.0171E+00 |
| A8 = | −1.2940E+03 | −5.5039E+01 | −5.5575E+00 |
| A10 = | 9.7163E+03 | 8.4686E+01 | 1.5444E+00 |
| A12 = | −2.2990E+04 | −7.0605E+01 | 2.7996E+00 |
| A14 = | — | 2.5077E+01 | −1.6519E+00 |

In the image capturing lens assembly according to the 3rd embodiment, the definitions of these parameters shown in the following table are the same as those stated in the 1st embodiment with corresponding values for the 3rd embodiment. Moreover, these parameters can be calculated from Table 5 and Table 6 as the following values and satisfy the following conditions:

3rd Embodiment

| f [mm] | 1.16 | f2/f3 | −0.47 |
|---|---|---|---|
| Fno | 2.00 | f/EPD | 2.00 |
| HFOV [deg.] | 41.0 | SD/TD | 0.66 |
| CT2/CT1 | 0.53 | TL [mm] | 1.78 |
| R2/R1 | −2.13 | FOV [deg.] | 82.0 |

-continued

3rd Embodiment

| |(R3 − R4)/(R3 + R4)| | 0.06 | TL/tan(HFOV) [mm] | 2.05 |
|---|---|---|---|
| |(R5 − R6)/(R5 + R6)| | 0.17 | TL/ImgH | 1.78 |
| f/f2 | 0.65 | | |

4th Embodiment

Figure 7:
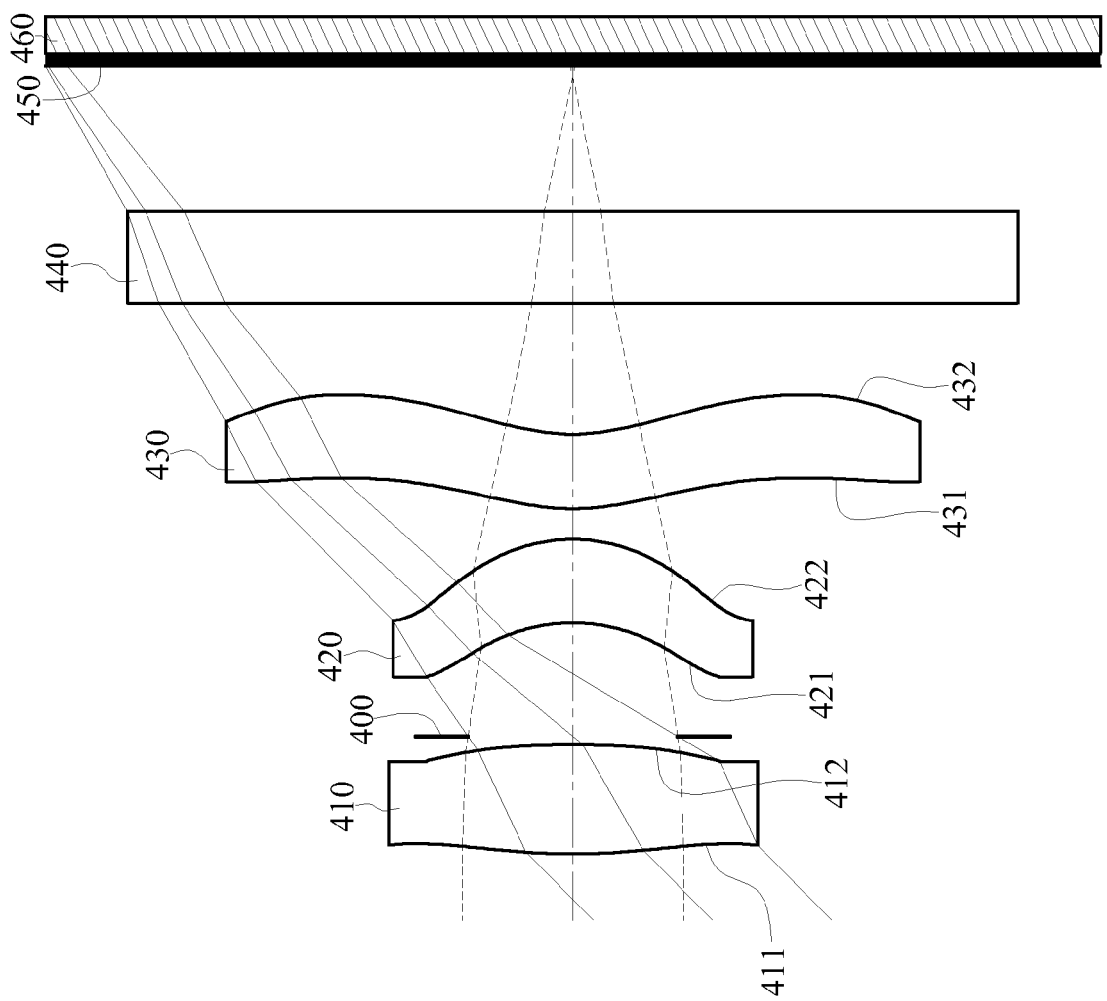
FIG. 7 is a schematic view of an image capturing device according to the 4th embodiment of the present disclosure.

FIG. 7 is a schematic view of an image capturing device according to the 4th embodiment of the present disclosure.

Figure 8:
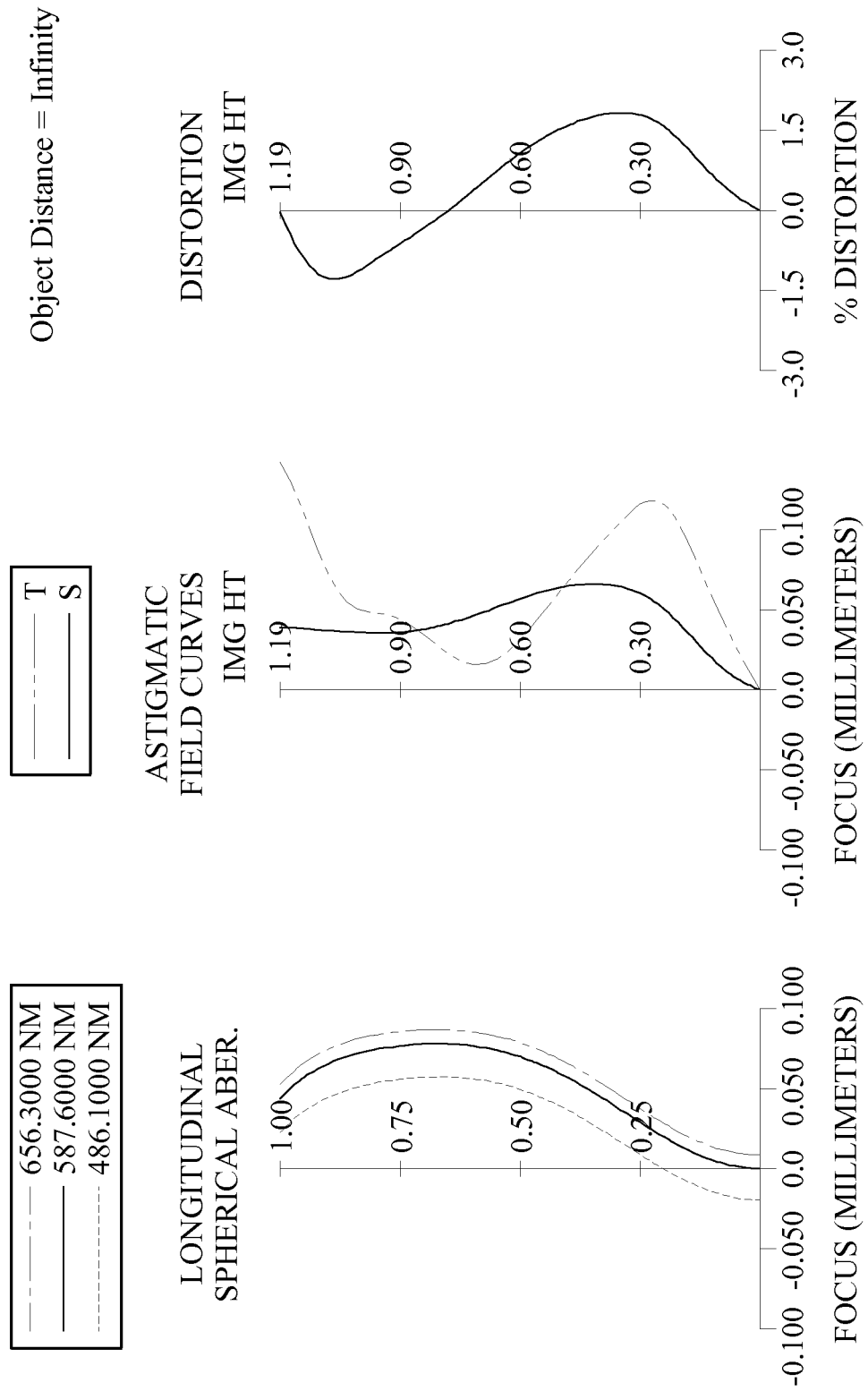
FIG. 8 shows spherical aberration curves, astigmatic field curves and a distortion curve of the image capturing device according to the 4th embodiment.

FIG. 8 shows, in order from left to right, spherical aberration curves, astigmatic field curves and a distortion curve of the image capturing device according to the 4th embodiment.

In FIG. 7, the image capturing device includes the image capturing lens assembly (not otherwise herein labeled) of the present disclosure and an image sensor 460. The image capturing lens assembly includes, in order from an object side to an image side, a first lens element 410, an aperture stop 400, a second lens element 420, a third lens element 430, an IR-cut filter 440 and an image plane 450, wherein the image capturing lens assembly has a total of three lens elements (410-430) with refractive power.

The first lens element 410 with positive refractive power has a convex object-side surface 411 and a convex image-side surface 412, which are both aspheric, and the first lens element 410 is made of plastic material.

The second lens element 420 with positive refractive power has a concave object-side surface 421 and a convex image-side surface 422, which are both aspheric, and the second lens element 420 is made of plastic material.

The third lens element 430 with negative refractive power has a convex object-side surface 431 in a paraxial region thereof and a concave image-side surface 432 in a paraxial region thereof, which are both aspheric, and the third lens element 430 is made of plastic material. Moreover, the object-side surface 431 of the third lens element 430 has at least one concave shape in an off-axis region thereof, and the image-side surface 432 of the third lens element 430 has at least one convex shape in an off-axis region thereof.

The IR-cut filter 440 is made of glass and located between the third lens element 430 and the image plane 450, and will not affect the focal length of the image capturing lens assembly. The image sensor 460 is disposed on the image plane 450 of the image capturing lens assembly.

The detailed optical data of the 4th embodiment are shown in Table 7 and the aspheric surface data are shown in Table 8 below.

TABLE 7

4th Embodiment
f = 1.16 mm, Fno = 2.30, HFOV = 44.8 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 1.484 | ASP | 0.250 | Plastic | 1.544 | 55.9 | 1.65 |
| 2 | | −2.150 | ASP | 0.019 | | | | |
| 3 | Ape. Stop | Plano | | 0.260 | | | | |
| 4 | Lens 2 | −0.385 | ASP | 0.191 | Plastic | 1.583 | 30.2 | 2.26 |
| 5 | | −0.352 | ASP | 0.070 | | | | |
| 6 | Lens 3 | 0.561 | ASP | 0.170 | Plastic | 1.640 | 23.3 | −9.09 |
| 7 | | 0.451 | ASP | 0.300 | | | | |
| 8 | IR-cut filter | Plano | | 0.210 | Glass | 1.517 | 64.2 | — |
| 9 | | Plano | | 0.334 | | | | |
| 10 | Image | Plano | | — | | | | |

Note:
Reference wavelength is 587.6 nm (d-line).

TABLE 8

Aspheric Coefficients

| Surface # | 1 | 2 | 4 |
|---|---|---|---|
| k = | 8.1209E+00 | 1.2985E+01 | −1.2813E+00 |
| A4 = | −1.1355E+00 | −9.8992E−01 | −2.8666E−01 |
| A6 = | −4.7695E+00 | −1.3495E+00 | −1.6785E+00 |
| A8 = | 3.5546E+00 | 3.2741E+01 | −1.0289E+03 |
| A10 = | — | — | 2.0894E+04 |
| A12 = | — | — | −9.4560E+04 |

| Surface # | 5 | 6 | 7 |
|---|---|---|---|
| k = | −6.9632E+00 | −1.0267E+00 | −5.5750E+00 |
| A4 = | −1.2407E+01 | −5.2527E+00 | −1.8038E+00 |
| A6 = | 1.3333E+02 | 2.0417E+01 | 4.6696E+00 |
| A8 = | −1.3978E+03 | −5.3565E+01 | −7.0755E+00 |
| A10 = | 9.5730E+03 | 8.5818E+01 | 2.1729E+00 |
| A12 = | −2.2990E+04 | −7.3875E+01 | 5.8650E+00 |
| A14 = | — | 2.6000E+01 | −4.4869E+00 |

In the image capturing lens assembly according to the 4th embodiment, the definitions of these parameters shown in the following table are the same as those stated in the 1st embodiment with corresponding values for the 4th embodiment. Moreover, these parameters can be calculated from Table 7 and Table 8 as the following values and satisfy the following conditions:

| 4th Embodiment | | | |
|---|---|---|---|
| f [mm] | 1.16 | f2/f3 | −0.25 |
| Fno | 2.30 | f/EPD | 2.30 |
| HFOV [deg.] | 44.8 | SD/TD | 0.72 |
| CT2/CT1 | 0.77 | TL [mm] | 1.80 |
| R2/R1 | −1.45 | FOV [deg.] | 89.6 |
| \|(R3 − R4)/(R3 + R4)\| | 0.04 | TL/tan(HFOV) [mm] | 1.82 |
| \|(R5 − R6)/(R5 + R6)\| | 0.11 | TL/ImgH | 1.50 |
| f/f2 | 0.51 | | |

5th Embodiment

Figure 9:
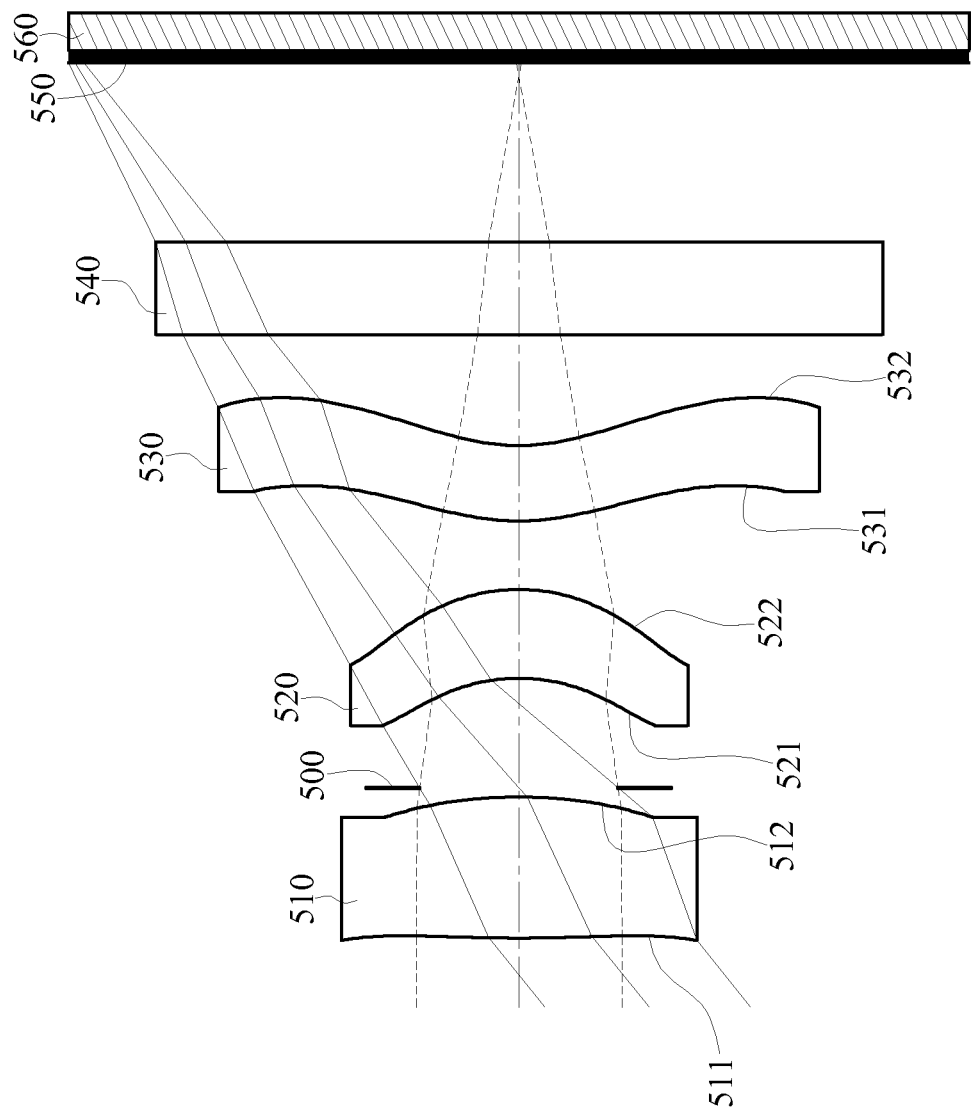
FIG. 9 is a schematic view of an image capturing device according to the 5th embodiment of the present disclosure.

FIG. 9 is a schematic view of an image capturing device according to the 5th embodiment of the present disclosure.

Figure 10:
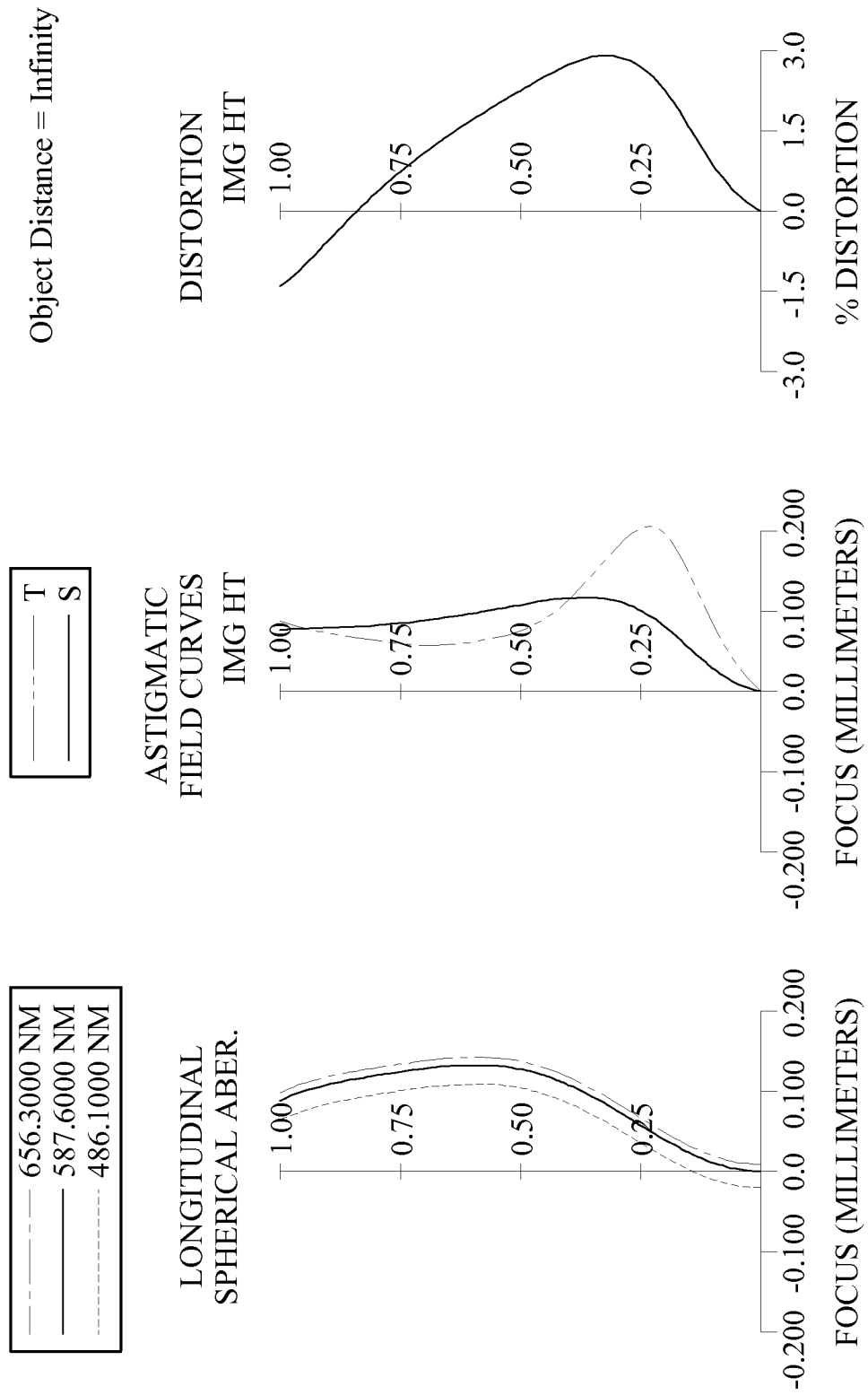
FIG. 10 shows spherical aberration curves, astigmatic field curves and a distortion curve of the image capturing device according to the 5th embodiment.

FIG. 10 shows, in order from left to right, spherical aberration curves, astigmatic field curves and a distortion curve of the image capturing device according to the 5th embodiment.

In FIG. 9, the image capturing device includes the image capturing lens assembly (not otherwise herein labeled) of the present disclosure and an image sensor 560. The image capturing lens assembly includes, in order from an object side to an image side, a first lens element 510, an aperture stop 500, a second lens element 520, a third lens element 530, an IR-cut filter 540 and an image plane 550, wherein the image capturing lens assembly has a total of three lens elements (510-530) with refractive power.

The first lens element 510 with positive refractive power has a convex object-side surface 511 and a convex image-side surface 512, which are both aspheric, and the first lens element 510 is made of plastic material.

The second lens element 520 with positive refractive power has a concave object-side surface 521 and a convex image-side surface 522, which are both aspheric, and the second lens element 520 is made of plastic material.

The third lens element 530 with negative refractive power has a convex object-side surface 531 in a paraxial region thereof and a concave image-side surface 532 in a paraxial region thereof, which are both aspheric, and the third lens element 530 is made of plastic material. Moreover, the object-side surface 531 of the third lens element 530 has at least one concave shape in an off-axis region thereof, and the image-side surface 532 of the third lens element 530 has at least one convex shape in an off-axis region thereof.

The IR-cut filter 540 is made of glass and located between the third lens element 530 and the image plane 550, and will not affect the focal length of the image capturing lens assembly. The image sensor 560 is disposed on the image plane 550 of the image capturing lens assembly.

The detailed optical data of the 5th embodiment are shown in Table 9 and the aspheric surface data are shown in Table 10 below.

TABLE 9

5th Embodiment
f = 1.16 mm, Fno = 2.50, HFOV = 39.1 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 3.746 | ASP | 0.318 | Plastic | 1.535 | 56.3 | 1.59 |
| 2 | | −1.070 | ASP | 0.020 | | | | |
| 3 | Ape. Stop | Plano | | 0.247 | | | | |
| 4 | Lens 2 | −0.394 | ASP | 0.200 | Plastic | 1.607 | 26.6 | 2.74 |
| 5 | | −0.380 | ASP | 0.154 | | | | |
| 6 | Lens 3 | 0.542 | ASP | 0.170 | Plastic | 1.640 | 23.3 | −15.88 |
| 7 | | 0.451 | ASP | 0.250 | | | | |
| 8 | IR-cut filter | Plano | | 0.210 | Glass | 1.517 | 64.2 | — |
| 9 | | Plano | | 0.403 | | | | |
| 10 | Image | Plano | | — | | | | |

Note:
Reference wavelength is 587.6 nm (d-line).

TABLE 10

Aspheric Coefficients

| Surface # | 1 | 2 | 4 |
|---|---|---|---|
| k = | −5.5472E+01 | −2.2584E+01 | −1.9330E+00 |
| A4 = | −4.8228E−01 | −2.5880E+00 | −1.3780E+00 |
| A6 = | −5.2370E+00 | 9.9413E+00 | −1.2585E+01 |
| A8 = | 1.4252E+01 | −2.8688E+00 | −4.6697E+02 |
| A10 = | — | — | 1.6829E+04 |
| A12 = | — | — | −9.4560E+04 |

| Surface # | 5 | 6 | 7 |
|---|---|---|---|
| k = | −1.2134E+01 | −9.0117E−01 | −4.8320E+00 |
| A4 = | −1.5378E+01 | −4.6457E+00 | −1.3271E+00 |
| A6 = | 1.8895E+02 | 1.6834E+01 | 2.8468E+00 |
| A8 = | −1.7808E+03 | −5.1818E+01 | −5.8304E+00 |
| A10 = | 1.0315E+04 | 9.0692E+01 | 4.0911E+00 |
| A12 = | −2.2990E+04 | −5.8273E+01 | 5.2831E+00 |
| A14 = | — | −1.4871E+01 | −7.3697E+00 |

In the image capturing lens assembly according to the 5th embodiment, the definitions of these parameters shown in the following table are the same as those stated in the 1st embodiment with corresponding values for the 5th embodiment. Moreover, these parameters can be calculated from Table 9 and Table 10 as the following values and satisfy the following conditions:

| 5th Embodiment | | | |
|---|---|---|---|
| f [mm] | 1.16 | f2/f3 | −0.17 |
| Fno | 2.50 | f/EPD | 2.50 |
| HFOV [deg.] | 39.1 | SD/TD | 0.70 |
| CT2/CT1 | 0.63 | TL [mm] | 1.97 |
| R2/R1 | −0.29 | FOV [deg.] | 78.2 |
| |(R3 − R4)/(R3 + R4)| | 0.02 | TL/tan(HFOV) [mm] | 2.43 |
| |(R5 − R6)/(R5 + R6)| | 0.09 | TL/ImgH | 1.97 |
| f/f2 | 0.42 | | |

6th Embodiment

Figure 11:
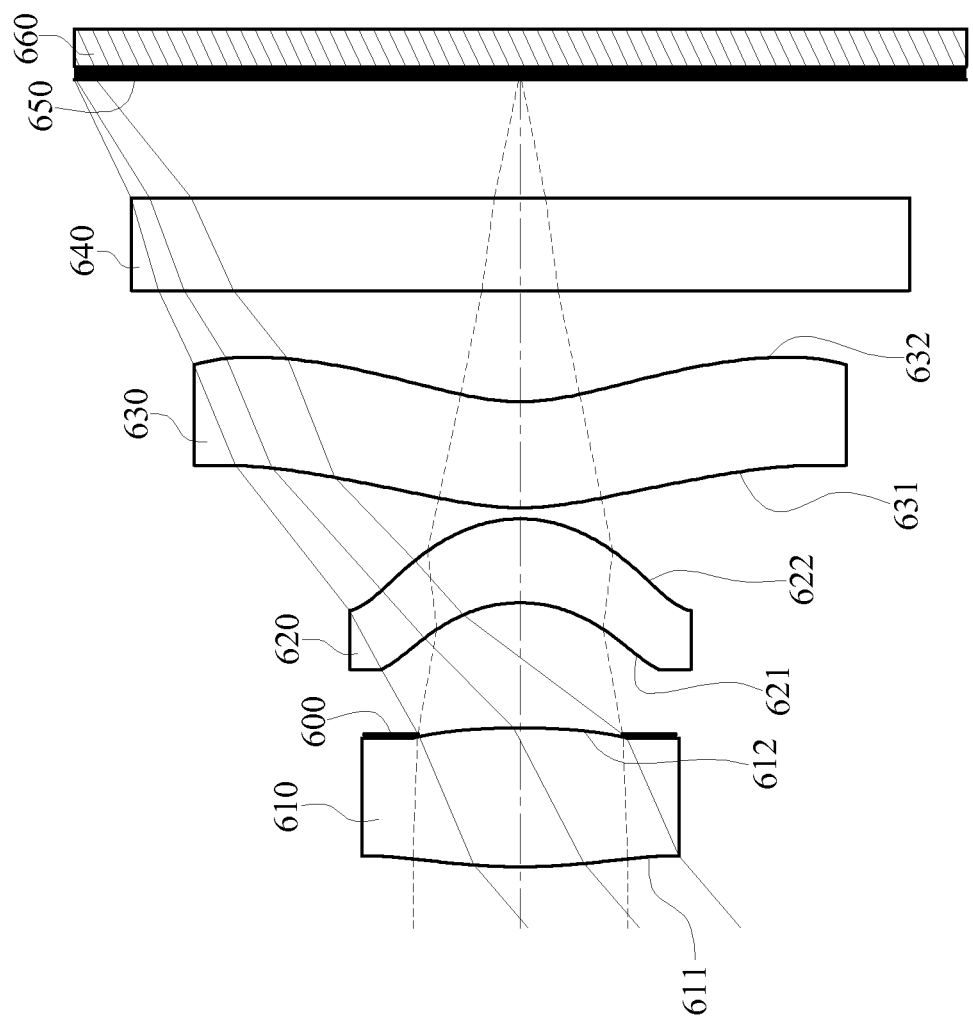
FIG. 11 is a schematic view of an image capturing device according to the 6th embodiment of the present disclosure.
Figure 12:
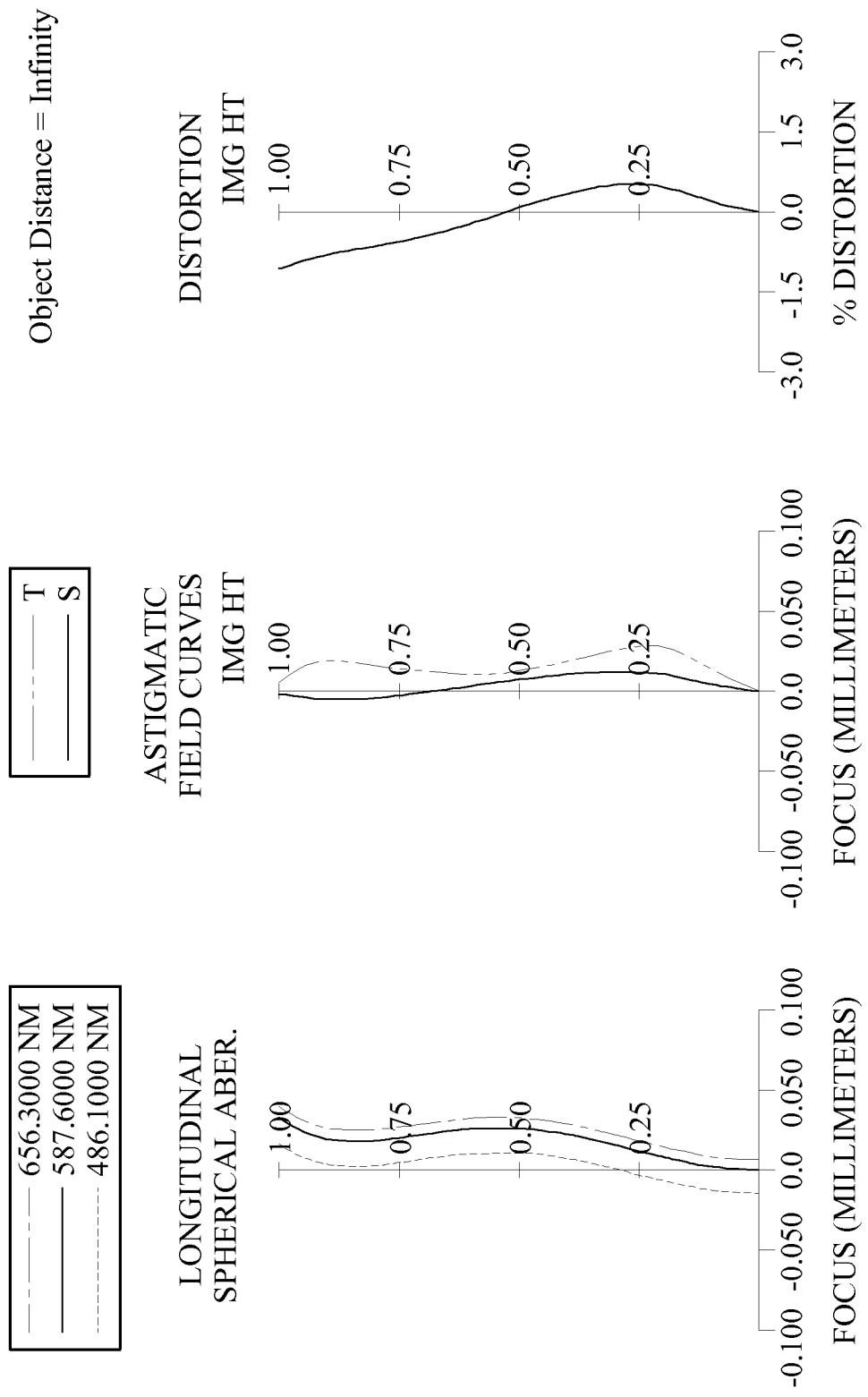
FIG. 12 shows spherical aberration curves, astigmatic field curves and a distortion curve of the image capturing device according to the 6th embodiment.

FIG. 11 is a schematic view of an image capturing device according to the 6th embodiment of the present disclosure. FIG. 12 shows, in order from left to right, spherical aberration curves, astigmatic field curves and a distortion curve of the image capturing device according to the 6th embodiment.

In FIG. 11, the image capturing device includes the image capturing lens assembly (not otherwise herein labeled) of the present disclosure and an image sensor 660. The image capturing lens assembly includes, in order from an object side to an image side, a first lens element 610, an aperture stop 600, a second lens element 620, a third lens element 630, an IR-cut filter 640 and an image plane 650, wherein the image capturing lens assembly has a total of three lens elements (610-630) with refractive power.

The first lens element 610 with positive refractive power has a convex object-side surface 611 and a convex image-side surface 612, which are both aspheric, and the first lens element 610 is made of plastic material.

The second lens element 620 with positive refractive power has a concave object-side surface 621 and a convex image-side surface 622, which are both aspheric, and the second lens element 620 is made of plastic material.

The third lens element 630 with negative refractive power has a convex object-side surface 631 in a paraxial region thereof and a concave image-side surface 632 in a paraxial region thereof, which are both aspheric, and the third lens element 630 is made of plastic material. Moreover, the object-side surface 631 of the third lens element 630 has at least one concave shape in an off-axis region thereof, and the image-side surface 632 of the third lens element 630 has at least one convex shape in an off-axis region thereof.

The IR-cut filter 640 is made of glass and located between the third lens element 630 and the image plane 650, and will not affect the focal length of the image capturing lens assembly. The image sensor 660 is disposed on the image plane 650 of the image capturing lens assembly.

The detailed optical data of the 6th embodiment are shown in Table 11 and the aspheric surface data are shown in Table 12 below.

TABLE 11

6th Embodiment
f = 1.16 mm, Fno = 2.40, HFOV = 40.7 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 1.371 | ASP | 0.313 | Plastic | 1.544 | 55.9 | 1.40 |
| 2 | | −1.589 | ASP | −0.015 | | | | |
| 3 | Ape. Stop | Plano | | 0.297 | | | | |
| 4 | Lens 2 | −0.292 | ASP | 0.189 | Plastic | 1.544 | 55.9 | 2.63 |
| 5 | | −0.298 | ASP | 0.025 | | | | |
| 6 | Lens 3 | 0.655 | ASP | 0.239 | Plastic | 1.544 | 55.9 | −7.32 |
| 7 | | 0.490 | ASP | 0.250 | | | | |
| 8 | IR-cut filter | Plano | | 0.210 | Glass | 1.517 | 64.2 | — |
| 9 | | Plano | | 0.267 | | | | |
| 10 | Image | Plano | | — | | | | |

Note:
Reference wavelength is 587.6 nm (d-line).

TABLE 12

Aspheric Coefficients

| Surface # | 1 | 2 | 4 |
|---|---|---|---|
| k = | −3.5816E+00 | −8.9231E+01 | −2.5357E+00 |
| A4 = | −9.3307E−01 | −3.3670E+00 | −5.9941E+00 |
| A6 = | 2.2485E−01 | −2.7292E−02 | −1.1447E+01 |
| A8 = | −2.1919E+01 | 1.4295E+02 | −4.1117E+02 |
| A10 = | — | — | 1.8241E+04 |
| A12 = | — | — | −9.4560E+04 |

| Surface # | 5 | 6 | 7 |
|---|---|---|---|
| k = | −3.6715E+00 | −2.1994E+00 | −7.2018E+00 |
| A4 = | −1.0995E+01 | −3.7022E+00 | −1.2793E+00 |
| A6 = | 1.0433E+02 | 1.8609E+01 | 3.6037E+00 |
| A8 = | −1.1556E+03 | −5.5221E+01 | −5.4395E+00 |
| A10 = | 9.0166E+03 | 9.1726E+01 | 1.5935E+00 |
| A12 = | −2.2990E+04 | −7.8819E+01 | 3.2563E+00 |
| A14 = | — | 2.7336E+01 | −2.2184E+00 |

In the image capturing lens assembly according to the 6th embodiment, the definitions of these parameters shown in the following table are the same as those stated in the 1st embodiment with corresponding values for the 6th embodiment. Moreover, these parameters can be calculated from Table 11 and Table 12 as the following values and satisfy the following conditions:

| 6th Embodiment | | | |
|---|---|---|---|
| f [mm] | 1.16 | f2/f3 | −0.36 |
| Fno | 2.40 | f/EPD | 2.40 |
| HFOV [deg.] | 40.7 | SD/TD | 0.72 |
| CT2/CT1 | 0.60 | TL [mm] | 1.77 |
| R2/R1 | −1.16 | FOV [deg.] | 81.4 |
| \|(R3 − R4)/(R3 + R4)\| | 0.01 | TL/tan(HFOV) [mm] | 2.06 |
| \|(R5 − R6)/(R5 + R6)\| | 0.14 | TL/ImgH | 1.77 |
| f/f2 | 0.44 | | |

7th Embodiment

Figure 13:
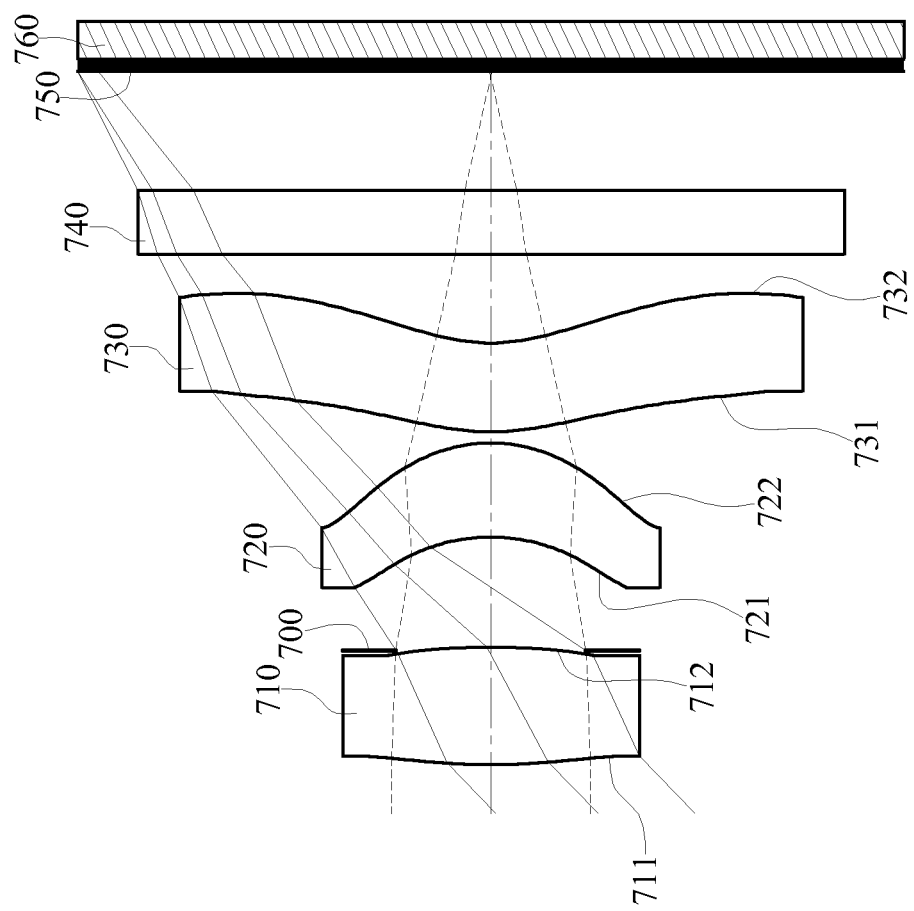
FIG. 13 is a schematic view of an image capturing device according to the 7th embodiment of the present disclosure.
Figure 14:
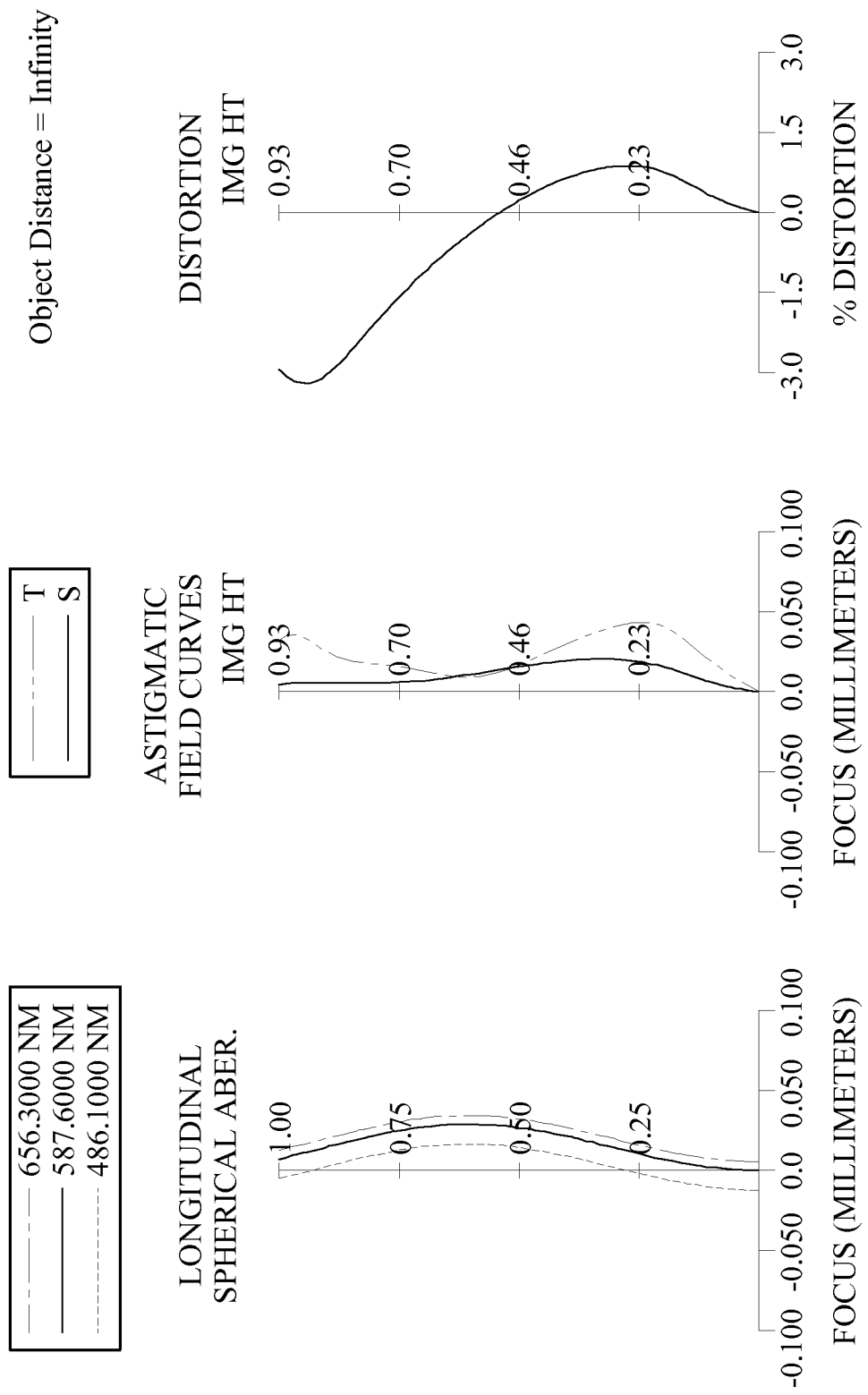
FIG. 14 shows spherical aberration curves, astigmatic field curves and a distortion curve of the image capturing device according to the 7th embodiment.

FIG. 13 is a schematic view of an image capturing device according to the 7th embodiment of the present disclosure. FIG. 14 shows, in order from left to right, spherical aberration curves, astigmatic field curves and a distortion curve of the image capturing device according to the 7th embodiment.

In FIG. 13, the image capturing device includes the image capturing lens assembly (not otherwise herein labeled) of the present disclosure and an image sensor 760. The image capturing lens assembly includes, in order from an object side to an image side, a first lens element 710, an aperture stop 700, a second lens element 720, a third lens element 730, an IR-cut filter 740 and an image plane 750, wherein the image capturing lens assembly has a total of three lens elements (710-730) with refractive power.

The first lens element 710 with positive refractive power has a convex object-side surface 711 and a convex image-side surface 712, which are both aspheric, and the first lens element 710 is made of plastic material.

The second lens element 720 with positive refractive power has a concave object-side surface 721 and a convex image-side surface 722, which are both aspheric, and the second lens element 720 is made of plastic material.

The third lens element 730 with negative refractive power has a convex object-side surface 731 in a paraxial region thereof and a concave image-side surface 732 in a paraxial region thereof, which are both aspheric, and the third lens element 730 is made of plastic material. Moreover, the object-side surface 731 of the third lens element 730 has at least one concave shape in an off-axis region thereof, and the image-side surface 732 of the third lens element 730 has at least one convex shape in an off-axis region thereof.

The IR-cut filter 740 is made of glass and located between the third lens element 730 and the image plane 750, and will not affect the focal length of the image capturing lens assembly. The image sensor 760 is disposed on the image plane 750 of the image capturing lens assembly.

The detailed optical data of the 7th embodiment are shown in Table 13 and the aspheric surface data are shown in Table 14 below.

TABLE 13

7th Embodiment
f = 0.98 mm, Fno = 2.20, HFOV = 43.9 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 1.427 | ASP | 0.265 | Plastic | 1.586 | 55.0 | 1.40 |
| 2 | | −1.800 | ASP | −0.008 | | | | |
| 3 | Ape. Stop | Plano | | 0.256 | | | | |
| 4 | Lens 2 | −0.391 | ASP | 0.212 | Plastic | 1.586 | 55.0 | 1.57 |
| 5 | | −0.329 | ASP | 0.025 | | | | |
| 6 | Lens 3 | 0.576 | ASP | 0.200 | Plastic | 1.614 | 25.6 | −3.89 |
| 7 | | 0.403 | ASP | 0.200 | | | | |
| 8 | IR-cut filter | Plano | | 0.145 | Glass | 1.517 | 64.2 | — |
| 9 | | Plano | | 0.268 | | | | |
| 10 | Image | Plano | | — | | | | |

Note:
Reference wavelength is 587.6 nm (d-line).

TABLE 14

Aspheric Coefficients

| Surface # | 1 | 2 | 4 |
|---|---|---|---|
| k = | −4.1987E+00 | −5.1392E+01 | −3.7701E+00 |
| A4 = | −1.2265E+00 | −2.1580E+00 | −4.7585E+00 |
| A6 = | 2.0408E+00 | −1.1633E+01 | 1.4589E+00 |
| A8 = | −3.6093E+01 | 1.8104E+02 | −8.0701E+02 |
| A10 = | — | — | 1.9921E+04 |
| A12 = | — | — | −9.4560E+04 |

| Surface # | 5 | 6 | 7 |
|---|---|---|---|
| k = | −4.9440E+00 | −1.0998E+00 | −5.2427E+00 |
| A4 = | −1.1258E+01 | −5.0724E+00 | −1.6137E+00 |
| A6 = | 1.1334E+02 | 2.0963E+01 | 4.3583E+00 |
| A8 = | −1.2871E+03 | −5.4591E+01 | −7.5428E+00 |
| A10 = | 9.4669E+03 | 8.4302E+01 | 4.4368E+00 |
| A12 = | −2.2990E+04 | −6.6919E+01 | 4.0930E+00 |
| A14 = | — | 2.1379E+01 | −3.2659E+00 |
| A16 = | — | −2.9673E+00 | −1.6683E+00 |

In the image capturing lens assembly according to the 7th embodiment, the definitions of these parameters shown in the following table are the same as those stated in the 1st embodiment with corresponding values for the 7th embodiment. Moreover, these parameters can be calculated from Table 13 and Table 14 as the following values and satisfy the following conditions:

7th Embodiment

| | | | |
|---|---|---|---|
| f [mm] | 0.98 | f2/f3 | −0.40 |
| Fno | 2.20 | f/EPD | 2.20 |
| HFOV [deg.] | 43.9 | SD/TD | 0.73 |
| CT2/CT1 | 0.80 | TL [mm] | 1.56 |
| R2/R1 | −1.26 | FOV [deg.] | 87.8 |
| |(R3 − R4)/(R3 + R4)| | 0.09 | TL/tan(HFOV) [mm] | 1.62 |
| |(R5 − R6)/(R5 + R6)| | 0.18 | TL/ImgH | 1.68 |
| f/f2 | 0.63 | | |

8th Embodiment

Figure 15:
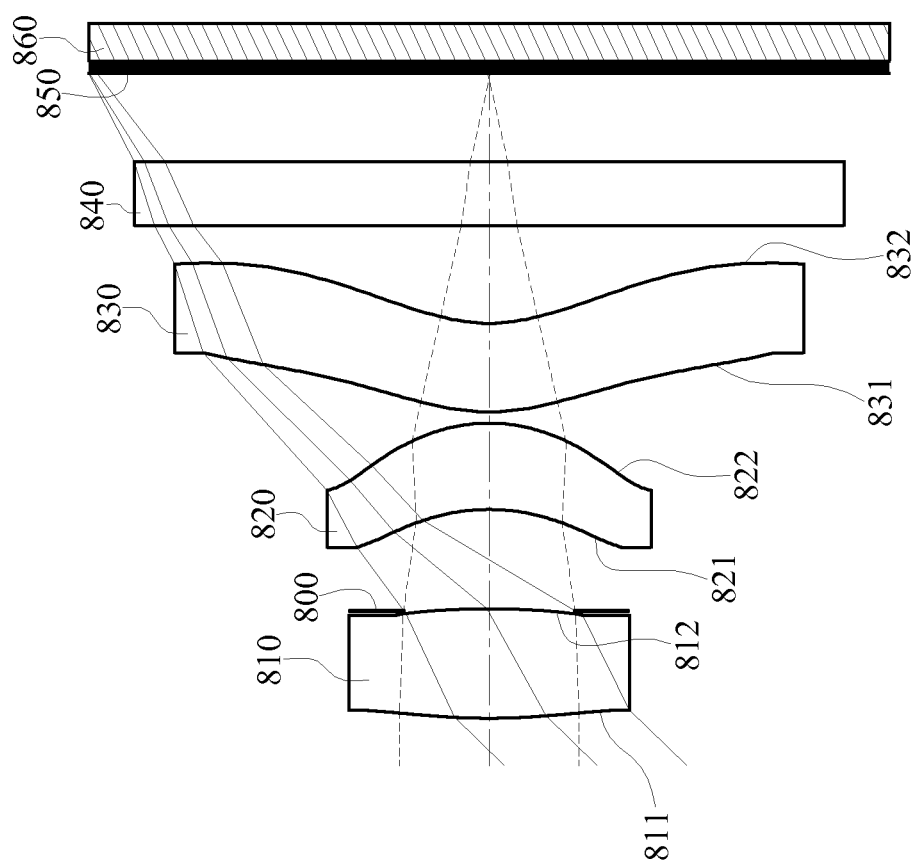
FIG. 15 is a schematic view of an image capturing device according to the 8th embodiment of the present disclosure.
Figure 16:
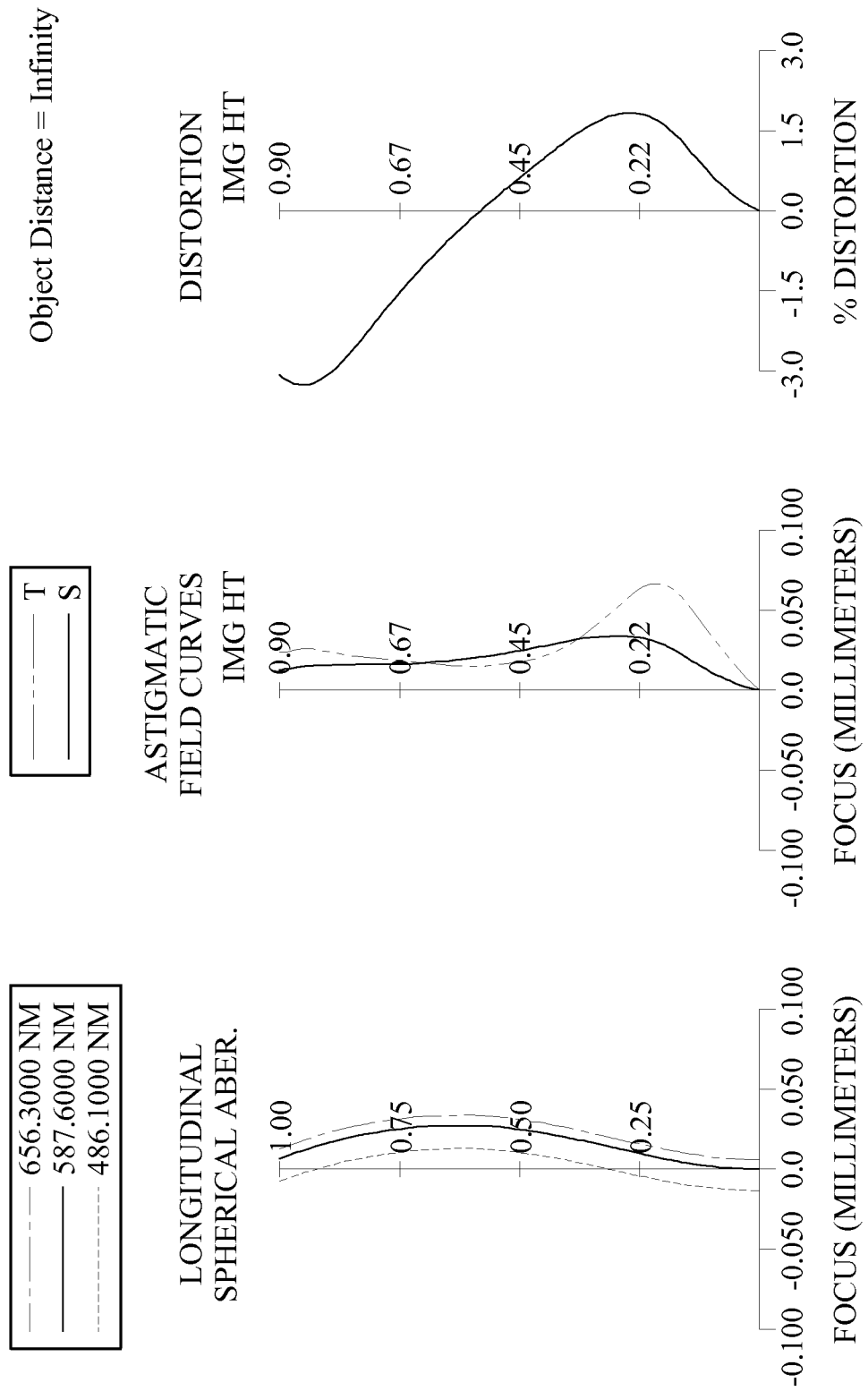
FIG. 16 shows spherical aberration curves, astigmatic field curves and a distortion curve of the image capturing device according to the 8th embodiment.

FIG. 15 is a schematic view of an image capturing device according to the 8th embodiment of the present disclosure. FIG. 16 shows, in order from left to right, spherical aberration curves, astigmatic field curves and a distortion curve of the image capturing device according to the 8th embodiment.

In FIG. 15, the image capturing device includes the image capturing lens assembly (not otherwise herein labeled) of the present disclosure and an image sensor 860. The image capturing lens assembly includes, in order from an object side to an image side, a first lens element 810, an aperture stop 800, a second lens element 820, a third lens element 830, an IR-cut filter 840 and an image plane 850, wherein the image capturing lens assembly has a total of three lens elements (810-830) with refractive power.

The first lens element 810 with positive refractive power has a convex object-side surface 811 and a convex image-side surface 812, which are both aspheric, and the first lens element 810 is made of glass material.

The second lens element 820 with positive refractive power has a concave object-side surface 821 and a convex image-side surface 822, which are both aspheric, and the second lens element 820 is made of plastic material.

The third lens element 830 with negative refractive power has a convex object-side surface 831 in a paraxial region thereof and a concave image-side surface 832 in a paraxial region thereof, which are both aspheric, and the third lens element 830 is made of plastic material. Moreover, the object-side surface 831 of the third lens element 830 has at least one concave shape in an off-axis region thereof, and the image-side surface 832 of the third lens element 830 has at least one convex shape in an off-axis region thereof.

The IR-cut filter 840 is made of glass and located between the third lens element 830 and the image plane 850, and will not affect the focal length of the image capturing lens assembly. The image sensor 860 is disposed on the image plane 850 of the image capturing lens assembly.

The detailed optical data of the 8th embodiment are shown in Table 15 and the aspheric surface data are shown in Table 16 below.

TABLE 15

8th Embodiment
f = 0.89 mm, Fno = 2.20, HFOV = 45.9 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 1.469 | ASP | 0.247 | Glass | 1.603 | 38.0 | 1.42 |
| 2 | | −1.912 | ASP | −0.004 | | | | |
| 3 | Ape. Stop | Plano | | 0.228 | | | | |
| 4 | Lens 2 | −0.408 | ASP | 0.195 | Plastic | 1.586 | 55.0 | 1.95 |
| 5 | | −0.353 | ASP | 0.025 | | | | |
| 6 | Lens 3 | 0.469 | ASP | 0.200 | Plastic | 1.586 | 55.0 | −43.35 |
| 7 | | 0.388 | ASP | 0.220 | | | | |
| 8 | IR-cut filter | Plano | | 0.145 | Glass | 1.517 | 64.2 | — |
| 9 | | Plano | | 0.198 | | | | |
| 10 | Image | Plano | | — | | | | |

Note:
Reference wavelength is 587.6 nm (d-line).

TABLE 16

Aspheric Coefficients

| Surface # | 1 | 2 | 4 |
|---|---|---|---|
| k = | −1.2224E+00 | −2.0696E+01 | −6.9503E+00 |
| A4 = | −1.3055E+00 | −1.7420E+00 | −4.7868E+00 |
| A6 = | 5.5074E−01 | −7.1560E−01 | 2.1451E+01 |
| A8 = | −2.8141E+01 | 2.8621E+01 | −7.9739E+02 |
| A10 = | — | — | 1.9005E+04 |
| A12 = | — | — | −9.4560E+04 |

| Surface # | 5 | 6 | 7 |
|---|---|---|---|
| k = | −7.6226E+00 | −9.9558E−01 | −3.9951E+00 |
| A4 = | −1.2148E+01 | −5.6843E+00 | −1.6872E+00 |
| A6 = | 1.2627E+02 | 2.1530E+01 | 4.3809E+00 |
| A8 = | −1.2443E+03 | −5.3532E+01 | −7.3765E+00 |
| A10 = | 9.1595E+03 | 8.3998E+01 | 4.6844E+00 |
| A12 = | −2.2990E+04 | −7.0743E+01 | 3.4379E+00 |
| A14 = | — | 2.0601E+01 | −2.5197E+00 |
| A16 = | — | 2.3995E+00 | −2.6819E+00 |

In the image capturing lens assembly according to the 8th embodiment, the definitions of these parameters shown in the following table are the same as those stated in the 1st embodiment with corresponding values for the 8th embodiment. Moreover, these parameters can be calculated from Table 15 and Table 16 as the following values and satisfy the following conditions:

| | 8th Embodiment | | |
|---|---|---|---|
| f [mm] | 0.89 | f2/f3 | −0.04 |
| Fno | 2.20 | f/EPD | 2.20 |
| HFOV [deg.] | 45.9 | SD/TD | 0.73 |
| CT2/CT1 | 0.79 | TL [mm] | 1.45 |
| R2/R1 | −1.30 | FOV [deg.] | 91.8 |
| |(R3 − R4)/(R3 + R4)| | 0.07 | TL/tan(HFOV) [mm] | 1.41 |
| |(R5 − R6)/(R5 + R6)| | 0.09 | TL/ImgH | 1.61 |
| f/f2 | 0.46 | | |

The aforementioned image capturing device can be installed in the mobile terminals. The first lens element of the image capturing lens assembly can have a convex object-side surface and a convex image-side surface, so that it is favorable for reducing the total track length of the image capturing device. In addition, the aperture stop can be close to the image plane which is favorable for increasing the field of view so as to obtain more of the image scene under a limited distance.

The foregoing description, for purpose of explanation, has been described with reference to specific embodiments. It is to be noted that TABLES 1-16 show different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. An image capturing lens assembly comprising, in order from an object side to an image side:
 a first lens element with positive refractive power having a convex object-side surface and a convex image-side surface, wherein the object-side surface and the image-side surface of the first lens element are aspheric;
 a second lens element with positive refractive power having a concave object-side surface and a convex image-side surface, wherein the object-side surface and the image-side surface of the second lens element are aspheric; and
 a third lens element with negative refractive power having a concave image-side surface in a paraxial region thereof, wherein the image-side surface of the third lens element has at least one convex shape in an off-axis region thereof, and an object-side surface and the image-side surface of the third lens element are aspheric;
 wherein the image capturing lens assembly has a total of three lens elements with refractive power and further includes a stop disposed between the first lens element and the second lens element, a focal length of the image capturing lens assembly is f, a focal length of the second lens element is f2, a focal length of the third lens element is f3, an axial distance between the stop and the image-side surface of the third lens element is SD, an axial distance between the object-side surface of the first lens element and the image-side surface of the third lens element is TD, a central thickness of the first lens element is CT1, a central thickness of the second lens element is CT2, an entrance pupil diameter of the image capturing lens assembly is EPD, and the following conditions are satisfied:

$-3.0 < f2/f3 < 0;$ $0.58 < SD/TD < 0.82;$ $0.20 < CT2/CT1 < 0.85;$ and $1.20 < f/EPD < 2.80.$ 2. The image capturing lens assembly of claim 1, wherein the third lens element has the object-side surface being convex in a paraxial region thereof, and the object-side surface of the third lens element has at least one concave shape in an off-axis region thereof.

3. The image capturing lens assembly of claim 1, wherein the focal length of the second lens element is f2, the focal length of the third lens element is f3, and the following condition is satisfied:

$-1.5 < f2/f3 < 0.$

4. The image capturing lens assembly of claim 1, wherein the central thickness of the first lens element is CT1, the central thickness of the second lens element is CT2, and the following condition is satisfied:

$0.30 < CT2/CT1 < 0.75.$

5. The image capturing lens assembly of claim 1, wherein a maximal field of view of the image capturing lens assembly is FOV, and the following condition is satisfied:

76 degrees < FOV < 120 degrees.

6. The image capturing lens assembly of claim 1, wherein an axial distance between the object-side surface of the first lens element and an image plane is TL, and the following condition is satisfied:

$1.0\ mm < TL < 2.3\ mm.$

7. The image capturing lens assembly of claim 1, wherein a curvature radius of the object-side surface of the third lens element is R5, a curvature radius of the image-side surface of the third lens element is R6, and the following condition is satisfied:

$|(R5-R6)/(R5+R6)| < 0.35.$

8. An image capturing lens assembly comprising, in order from an object side to an image side:
   a first lens element with positive refractive power having a convex object-side surface and a convex image-side surface, wherein the object-side surface and the image-side surface of the first lens element are aspheric;
   a second lens element with positive refractive power having a concave object-side surface and a convex image-side surface, wherein the object-side surface and the image-side surface of the second lens element are aspheric;
   a third lens element with negative refractive power having a convex object-side surface and a concave image-side surface in a paraxial region thereof, wherein the image-side surface of the third lens element has at least one convex shape in an off-axis region thereof, and the object-side surface and the image-side surface of the third lens element are aspheric; and
   wherein the image capturing lens assembly has a total of three lens elements with refractive power and further includes a stop disposed between the first lens element and the second lens element, a focal length of the second lens element is f2, a focal length of the third lens element is f3, an axial distance between the stop and the image-side surface of the third lens element is SD, an axial distance between the object-side surface of the first lens element and the image-side surface of the third lens element is TD, a curvature radius of the object-side surface of the first lens element is R1, and a curvature radius of the image-side surface of the first lens element is R2, the following conditions are satisfied:

$-0.90 < f2/f3 < 0;$ $0.58 < SD/TD < 0.82;$ and $-3.0 < R2/R1 < -0.2.$

9. The image capturing lens assembly of claim 8, wherein the curvature radius of the object-side surface of the first lens element is R1, the curvature radius of the image-side surface of the first lens element is R2, the following condition is satisfied:

$-2.0 < R2/R1 < -0.2.$

10. The image capturing lens assembly of claim 8, wherein a focal length of the image capturing lens assembly is f, the focal length of the second lens element is f2, and the following condition is satisfied:

$0.4 < f/f2 < 1.0.$

11. The image capturing lens assembly of claim 8, wherein a curvature radius of the object-side surface of the second lens element is R3, a curvature radius of the image-side surface of the second lens element is R4, and the following condition is satisfied:

$|(R3-R4)/(R3+R4)| < 0.15.$

12. The image capturing lens assembly of claim 8, wherein an axial distance between the object-side surface of the first lens element and an image plane is TL, a maximum image height of the image capturing lens assembly is ImgH, and the following condition is satisfied:

$TL/ImgH < 1.90.$

13. The image capturing lens assembly of claim 8, wherein a focal length of the image capturing lens assembly is f, an entrance pupil diameter of the image capturing lens assembly is EPD, and the following condition is satisfied:

$1.60 < f/EPD < 2.45.$

14. The image capturing lens assembly of claim 8, wherein a curvature radius of the object-side surface of the third lens element is R5, a curvature radius of the image-side surface of the third lens element is R6, and the following condition is satisfied:

$|(R5-R6)/(R5+R6)| < 0.25.$

15. The image capturing lens assembly of claim 8, wherein an axial distance between the object-side surface of the first lens element and an image plane is TL, half of a maximal field of view of the image capturing lens assembly is HFOV, and the following condition is satisfied:

$1.0\ mm < TL/\tan(HFOV) < 3.0\ mm.$

16. An image capturing lens assembly comprising, in order from an object side to an image side:
   a first lens element with positive refractive power having a convex object-side surface and a convex image-side surface, wherein the object-side surface and the image-side surface of the first lens element are aspheric;

a second lens element with positive refractive power having a concave object-side surface and a convex image-side surface, wherein the object-side surface and the image-side surface of the second lens element are aspheric;

a third lens element with negative refractive power having a convex object-side surface and a concave image-side surface in a paraxial region thereof, wherein the image-side surface of the third lens element has at least one convex shape in an off-axis region thereof, and the object-side surface and the image-side surface of the third lens element are aspheric; and wherein the image capturing lens assembly has a total of three lens elements with refractive power and further includes a stop disposed between the first lens element and the second lens element, a focal length of the second lens element is f2, a focal length of the third lens element is f3, an axial distance between the stop and the image-side surface of the third lens element is SD, an axial distance between the object-side surface of the first lens element and the image-side surface of the third lens element is TD, an axial distance between the object-side surface of the first lens element and an image plane is TL, and the following conditions are satisfied:

$-3.0 < f2/f3 < 0;$ $0.58 < SD/TD < 0.82;$ and $1.0 \text{ mm} < TL < 2.0 \text{ mm}.$ 17. The image capturing lens assembly of claim 16, wherein a curvature radius of the object-side surface of the third lens element is R5, a curvature radius of the image-side surface of the third lens element is R6, and the following condition is satisfied:

$|(R5-R6)/(R5+R6)| < 0.35.$

18. The image capturing lens assembly of claim 16, wherein a curvature radius of the object-side surface of the first lens element is R1, a curvature radius of the image-side surface of the first lens element is R2, and the following condition is satisfied:

$-2.0 < R2/R1 < -0.2.$

19. The image capturing lens assembly of claim 16, wherein the focal length of the second lens element is f2, the focal length of the third lens element is f3, and the following condition is satisfied:

$-0.90 < f2/f3 < 0.$

20. The image capturing lens assembly of claim 16, wherein a central thickness of the first lens element is CT1, a central thickness of the second lens element is CT2, and the following condition is satisfied:

$0.20 < CT2/CT1 < 0.85.$

21. The image capturing lens assembly of claim 16, wherein an axial distance between the object-side surface of the first lens element and the image plane is TL, half of a maximal field of view of the image capturing lens assembly is HFOV, and the following condition is satisfied:

$1.0 \text{ mm} < TL/\tan(\text{HFOV}) < 3.0 \text{ mm}.$

22. An image capturing device comprising, in order from an object side to an image side:
the image capturing lens assembly of claim 16; and
an image sensor.

23. A mobile terminal comprising,
the image capturing device of claim 22.

* * * * *